(12) United States Patent
Brooks et al.

(10) Patent No.: US 8,963,195 B2
(45) Date of Patent: Feb. 24, 2015

(54) FLEXIBLE LIGHTING DEVICE INCLUDING A HEAT-SPREADING LAYER

(71) Applicant: Grote Industries, LLC, Madison, IN (US)

(72) Inventors: Timothy Webster Brooks, Madison, IN (US); Scott J. Jones, Romeo, MI (US); Martin J. Marx, Madison, IN (US); Cesar Perez-Bolivar, Madison, IN (US); James E. Roberts, Madison, IN (US); George M. Richardson, II, Charlestown, IN (US)

(73) Assignee: Grote Industries, LLC, Madison, IN (US)

( * ) Notice: Subject to any disclaimer, the term of this patent is extended or adjusted under 35 U.S.C. 154(b) by 0 days.

(21) Appl. No.: 13/948,640

(22) Filed: Jul. 23, 2013

(65) Prior Publication Data
US 2014/0264424 A1  Sep. 18, 2014

Related U.S. Application Data

(63) Continuation-in-part of application No. 13/837,403, filed on Mar. 15, 2013.

(51) Int. Cl.
*H01L 33/00* (2010.01)

(52) U.S. Cl.
USPC ............... 257/99; 257/88; 257/100; 257/712; 257/E23.116

(58) Field of Classification Search
CPC . H01L 33/62; H01L 2251/5338; H01L 23/34; H01L 51/0097; H01L 23/4985; H01L 51/529

USPC ........... 257/81, 88, 89, 99, 100, 712; 345/76; 438/122

See application file for complete search history.

(56) References Cited

U.S. PATENT DOCUMENTS

| | | | |
|---|---|---|---|
| 8,482,212 B1 | 7/2013 | Ivey et al. | |
| 8,519,618 B2 * | 8/2013 | Shen | 313/505 |

(Continued)

FOREIGN PATENT DOCUMENTS

EP  2346309 A2  7/2011

OTHER PUBLICATIONS

The Extended European Search Report issued by the European Patent Office on Aug. 29, 2014 in corresponding European Patent Application No. 14159197.4 (English translation).

*Primary Examiner* — Marcos D. Pizarro
*Assistant Examiner* — Cesar Lopez
(74) *Attorney, Agent, or Firm* — Posz Law Group, PLC

(57) ABSTRACT

A lighting element, comprising: a first substrate; a first and second conductive elements located on the first substrate; a light-emitting element having first and second contacts that are both on a first surface of the light-emitting element, the first contact being electrically connected to the first conductive element, the second contact being electrically connected to the second conductive element, and the light-emitting element emitting light from a second surface opposite the first surface; a top layer adjacent to the second surface; and an affixing layer located between the first substrate and the top layer, the affixing layer affixing the top layer to the first substrate; and a heat spreading layer having a third surface and a fourth surface opposite the third surface, the heat spreading layer being affixed beneath the first flexible substrate at the third surface, wherein the flexible top layer is substantially transparent to light.

19 Claims, 15 Drawing Sheets

(56) References Cited

U.S. PATENT DOCUMENTS

| | | |
|---|---|---|
| 2002/0060526 A1 | 5/2002 | Timmermans et al. |
| 2004/0223328 A1 | 11/2004 | Lee et al. |
| 2009/0201699 A1 | 8/2009 | Ohno |
| 2009/0284904 A1* | 11/2009 | Wu et al. ......... 361/679.01 |
| 2012/0193648 A1 | 8/2012 | Donofrio et al. |

* cited by examiner

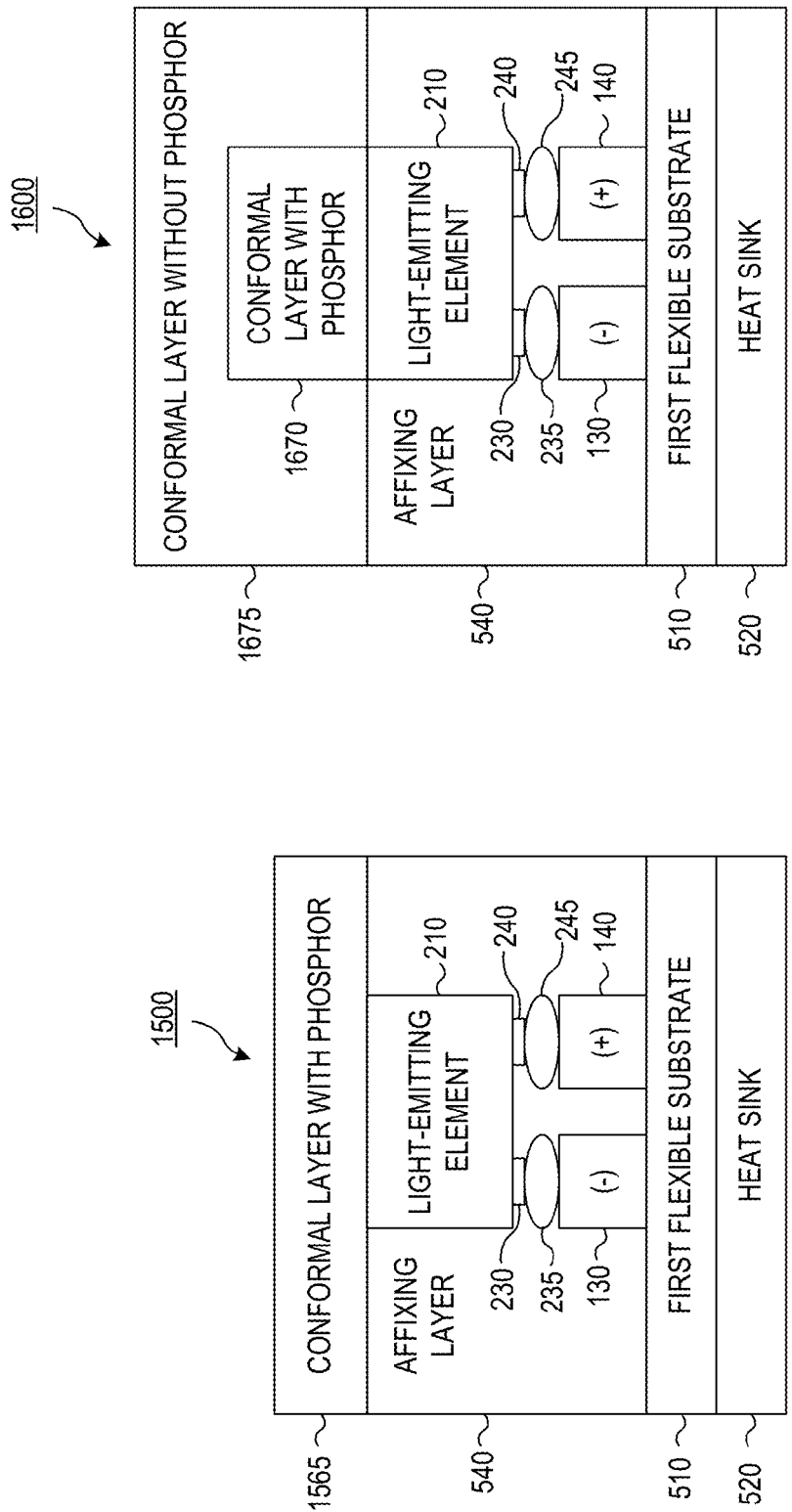

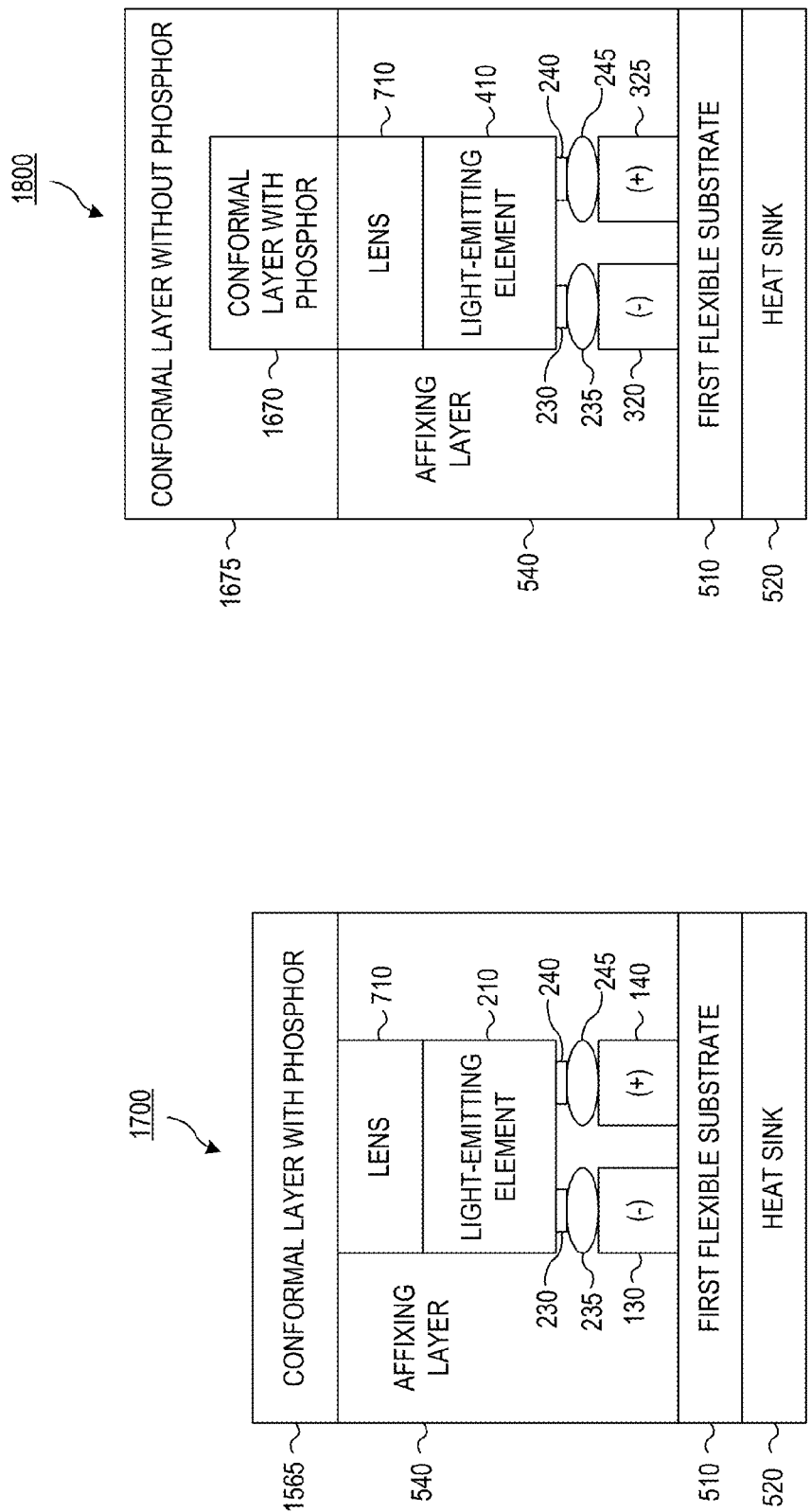

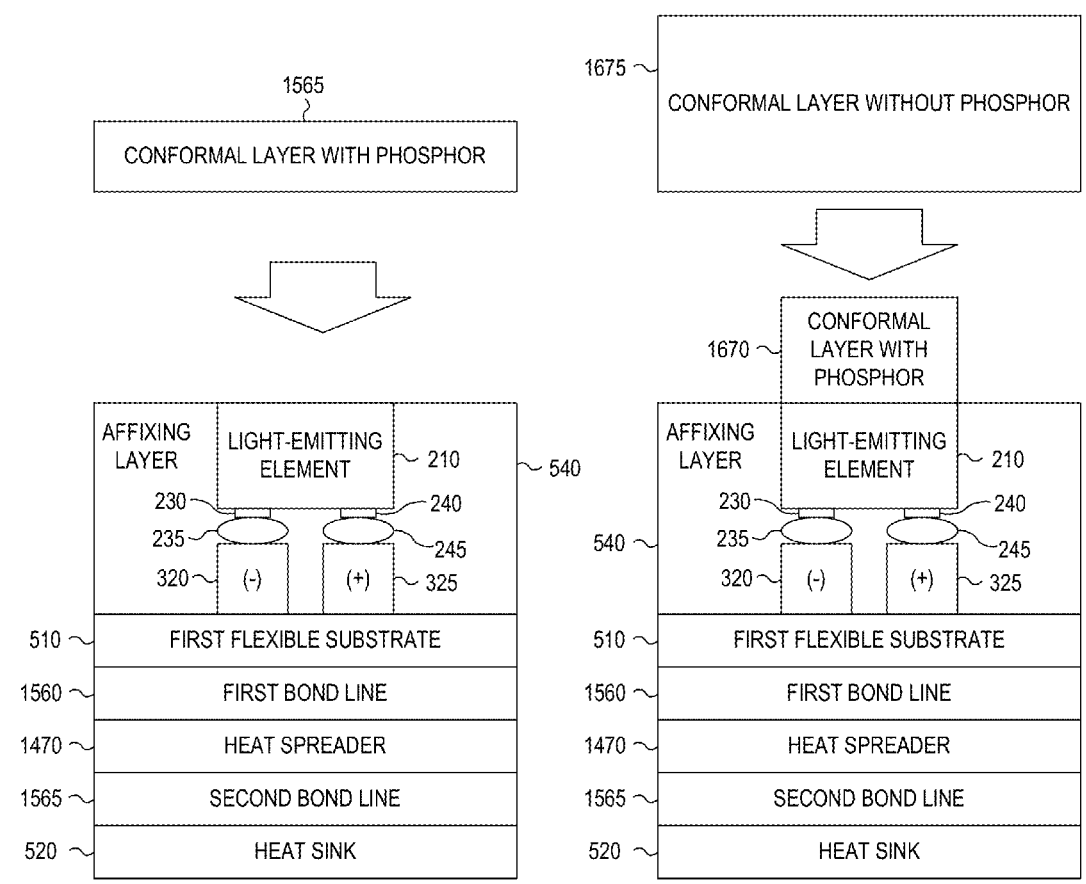

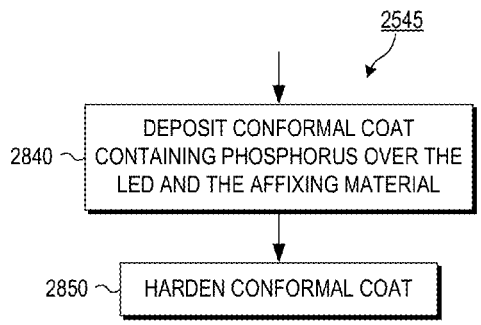
FIG. 26
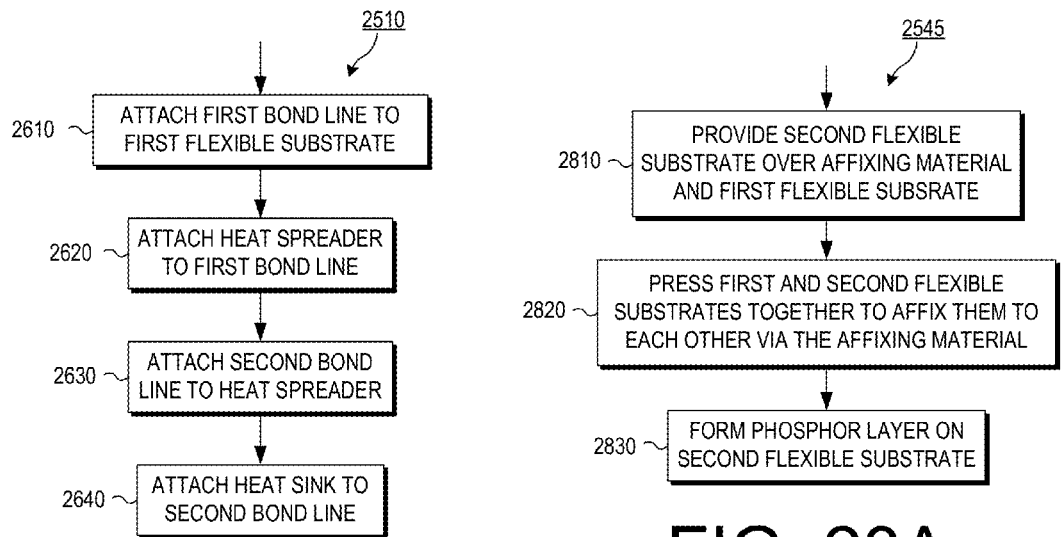
FIG. 28A
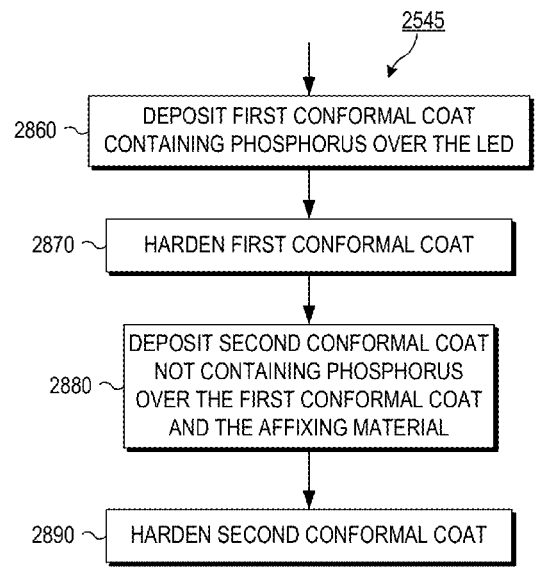
FIG. 28B
FIG. 28C

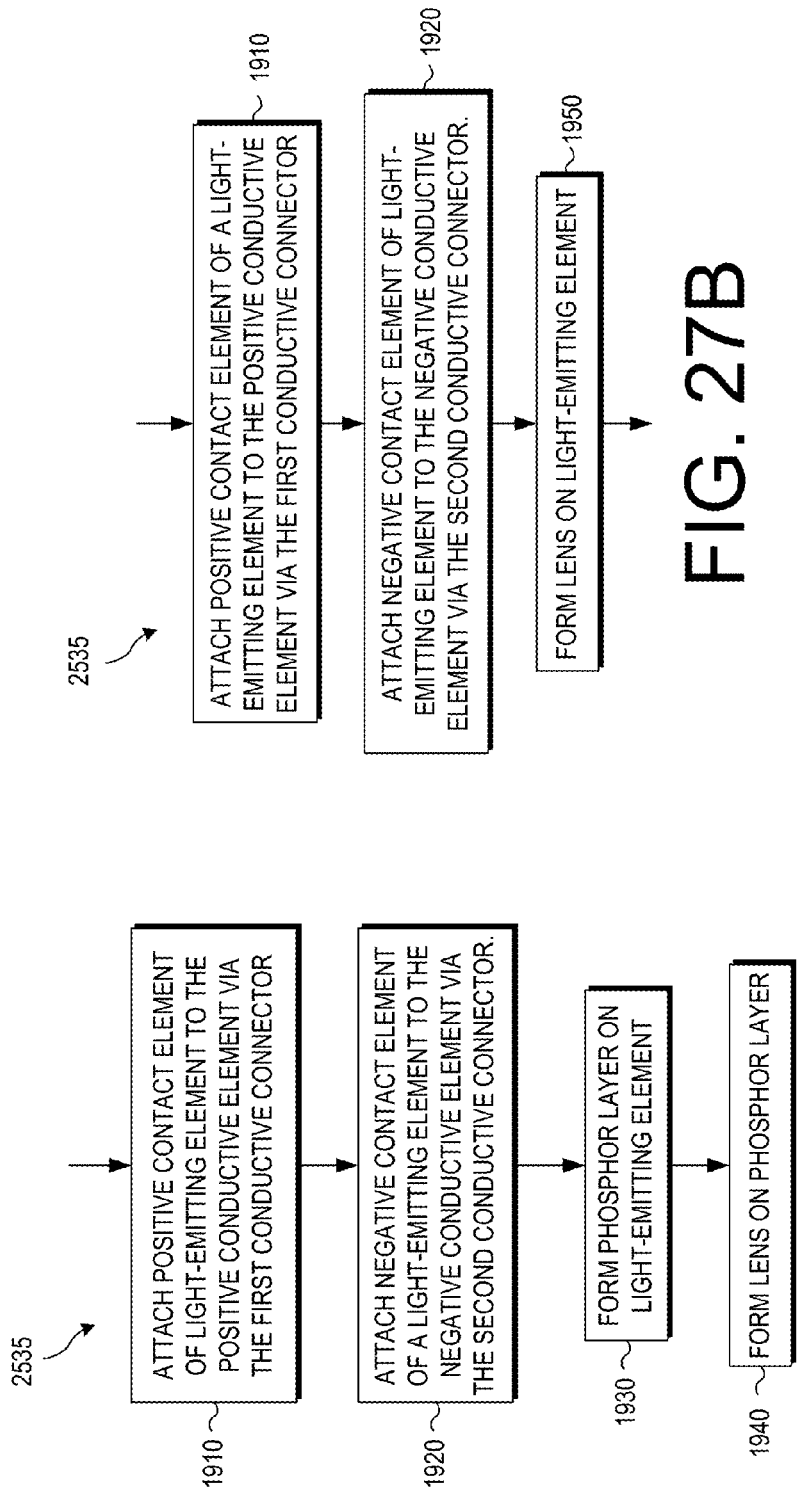

FLEXIBLE LIGHTING DEVICE INCLUDING A HEAT-SPREADING LAYER

CROSS-REFERENCE TO RELATED APPLICATIONS

The present application is a continuation in part of U.S. patent application Ser. No. 13/837,403, filed on 15 Mar. 2013, entitled "FLEXIBLE LIGHTING DEVICE," the contents of which are hereby incorporated by reference in their entirety.

FIELD OF THE INVENTION

The present invention relates generally to a thin, flexible device that contains a number of controllable lighting elements on it. More particularly, the present invention relates to a thin, flexible device containing a number of light-emitting diodes that can be controlled to light up.

BACKGROUND OF THE INVENTION

Light-emitting diodes (LEDs) can be used to provide low-cost, low-power lighting in a variety of situations. However, because LEDs can have complex designs, the resulting device can be relatively thick, limiting their usefulness in space-sensitive situations.

Furthermore, the desire to keep devices as thin as possible limits the size of the LEDs that can be used in a lighting device, thereby limiting the amount of light the lighting device can produce.

In addition, many LED devices are rigid devices, which limit their use in many situations by fixing their sizes and shapes.

It would therefore be desirable to provide a thin, low-power, flexible lighting device that includes one or more relatively large lighting elements, but that can be easily manufactured.

SUMMARY OF THE INVENTION

A flexible lighting element, is provided comprising of: a first flexible substrate; a first conductive element located on the first flexible substrate; a second conductive element located on the first flexible substrate; a light-emitting diode having a positive contact and a negative contact, the positive and negative contacts both being on a first side of the light-emitting diode, the light-emitting diode being configured to emit light having a selected wavelength between 10 nm and 100,000 nm; a first conductive connector located between the first conductive element and the positive contact, the first conductive connector being configured to electrically connect the first conductive element to the positive contact; a second conductive connector located between the second conductive element and the negative contact, the second conductive connector being configured to electrically connect the second conductive element to the negative contact; (in certain configurations) a second flexible substrate located adjacent to a second surface of the light-emitting diode, the second surface of the light-emitting diode being on an opposite side of the light-emitting diode from the first surface of the light-emitting diode; and an affixing layer located between the first flexible substrate and the second flexible substrate, the affixing layer being configured to affix the second flexible substrate to the first flexible substrate, wherein the second flexible substrate is substantially transparent to the selected wavelength of light, and the first and second conductive connectors each comprise either an epoxy dot or an applied metal pad.

The first flexible substrate may comprise at least one of: polyethylene terephthalate (PET), polyethylene napthalate (PEN), polyester, a polymer, an oxide-coated polymer, a flexible plastic, or a metal-coated flexible plastic. The first and second conductive elements may both be buss bars. The first and second conductive elements may comprise at least one of: a conductive metal or a conductive oxide. The first and second conductive elements may comprise at least one of: copper, silver, aluminum or alloys of these elements. The first and second conductive connectors may comprise at least one of: silver epoxy, applied metal pad, conductive adhesive, metal pads, and daub pots. The affixing layer may comprise at least one of: a hot melt adhesive, a cross-link material, or an epoxy-type adhesive. The second flexible substrate may comprise at least one of: polyethylene terephthalate (PET), polyethylene napthalate (PEN), transparent polyester, a transparent polymer, a transparent oxide-coated polymer, or a transparent flexible plastic.

The flexible lighting element may further comprise a phosphor layer located between the second surface of the light-emitting diode and the second flexible substrate, wherein the light-emitting diode emits light having a wavelength between 300 nm and 500 nm. The flexible lighting element may further comprise a phosphor layer located on the second flexible substrate, wherein the light-emitting diode emits light having a wavelength between 300 nm and 500 nm.

The flexible lighting element may further comprise a first heat sink attached to the first flexible substrate, wherein the first heat sink comprises either a flexible metal layer or a flexible ceramic thin film layer. The flexible lighting element may further comprise a second heat sink attached to the second flexible substrate, wherein the second heat sink comprises either a flexible metal layer or a flexible ceramic thin film layer. The flexible lighting element may further comprise a plurality of conductive columns located between the first flexible substrate and the second flexible substrate, wherein the plurality of conductive columns each comprise either a flexible metal or a flexible ceramic thin film.

The light-emitting diode may be an ultrathin light-emitting diode, having a thickness of between 3 mil and 20 mil.

A flexible lighting element is provided, comprising: a first flexible substrate; a first conductive element located on the first flexible substrate; a second conductive element located on the first flexible substrate; a light-emitting diode having a positive contact and a negative contact, the positive and negative contacts both being on a first side of the light-emitting diode, the light-emitting diode being configured to emit light having a selected wavelength between 10 nm and 100,000 nm; a first conductive connector located between the first conductive element and the positive contact, the first conductive connector being configured to electrically connect the first conductive element to the positive contact; a second conductive connector located between the second conductive element and the negative contact, the second conductive connector being configure to electrically connect the second conductive element to the negative contact; a second flexible substrate located adjacent to a second surface of the light-emitting diode, the second surface of the light-emitting diode being on an opposite side of the light-emitting diode from the first surface of the light-emitting diode; and an affixing layer located between the first flexible substrate and the second flexible substrate, the affixing layer being configured to affix the second flexible substrate to the first flexible substrate, wherein the second flexible substrate is substantially transparent to the selected wavelength of light, and the light-emitting diode is an ultrathin light-emitting diode, having a thickness of between 3 mil and 20 mil.

The first flexible substrate may comprise at least one of: polyethylene terephthalate (PET), polyethylene napthalate (PEN), polyester, a polymer, an oxide-coated polymer, a flexible plastic, or a metal-coated flexible plastic. The first and second conductive elements may both be buss bars. The first and second conductive elements may comprise at least one of: a conductive metal or a conductive oxide. The first and second conductive elements may comprise at least one of: copper, silver, aluminum or alloys of these elements. The first and second conductive connectors may comprise at least one of: silver epoxy, applied metal pad, conductive adhesive, and metal pads. The affixing layer may comprise at least one of: a hot melt adhesive, a cross-link material, or an epoxy-type adhesive. The second flexible substrate may comprise at least one of: polyethylene terephthalate (PET), polyethylene napthalate (PEN), transparent polyester, a transparent polymer, a transparent oxide-coated polymer, or a transparent flexible plastic.

The flexible lighting element may further comprise a phosphor layer located between the second surface of the light-emitting diode and the second flexible substrate, wherein the light-emitting diode emits light having a wavelength between 10 nm and 490 nm The flexible lighting element may further comprise a phosphor layer located between the second surface of the light-emitting diode and the second flexible substrate, wherein the light-emitting diode emits light having a wavelength between 10 nm and 490 nm. The flexible lighting element may further comprise a first heat sink attached to the first flexible substrate, wherein the first heat sink comprises either a flexible metal layer or a flexible ceramic thin film layer. The flexible lighting element may further comprise a second heat sink attached to the second flexible substrate, wherein the second heat sink comprises either a flexible metal layer or a flexible ceramic thin film layer. The flexible lighting element may further comprise a plurality of conductive columns located between the first flexible substrate and the second flexible substrate, wherein the plurality of conductive columns each comprise either a flexible metal or a flexible ceramic thin film.

A method of assembling a flexible lighting element is provided, comprising attaching a first conductive element to the first flexible substrate and then attaching a second conductive element to the first flexible substrate; connecting a positive contact of a light-emitting diode to the first conductive element and connecting the negative contact of a light-emitting diode to the second conductive element; attaching an affixing layer over the light-emitting diode on the first flexible substrate, and then attaching over the affixing layer a second flexible substrate, wherein the flexible second flexible substrate is substantially transparent to the selected frequency of light, the first and second conductive connectors each comprise either a conductive dot or and applied metal pad, the positive and negative contacts are both on the first side of the light-emitting diode, and the light-emitting diode is configured to emit light in a selected frequency.

The first flexible substrate may comprise at least one of: polyethylene terephthalate (PET), polyethylene napthalate (PEN), polyester, a polymer, an oxide-coated polymer, a flexible plastic, or a metal-coated flexible plastic. The first and second conductive elements may both be buss bars. The first and second conductive elements may comprise at least one of: a conductive metal or a conductive oxide. The first and second conductive elements may comprise at least one of: copper, silver, aluminum, or alloys of these materials. The affixing layer may comprise at least one of: a hot melt adhesive, a cross-link material, or an epoxy-type adhesive. The first and second conductive connectors may comprise at least one of: silver epoxy, applied metal pad, conductive adhesive, metal pads, and daub pots.

The method may further comprise forming a phosphor layer on the second surface of the light-emitting diode, wherein the light-emitting diode emits light having a wavelength between 300 nm and 500 nm. The method may further comprise forming a phosphor layer on the second flexible substrate, wherein the light-emitting diode emits light having a wavelength between 300 nm and 500 nm.

The light-emitting diode may be an ultrathin light-emitting diode, having a thickness of between 5 mil and 20 mil.

The method may further comprise attaching a first heat sink to the first flexible substrate. The method may further comprise attaching a second heat sink to the second flexible substrate. The method may further comprise forming a plurality of conducting columns between the first heat sink and the second heat sink.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention. These drawings are not necessarily drawn to scale.

FIG. 15 is a side cross-sectional view of the flexible lighting device of FIG. 1 along the line V-V' in FIG. 2 according to yet another disclosed embodiment;

FIG. 16 is a side cross-sectional view of the flexible lighting device of FIG. 1 along the line V-V' in FIG. 2 according to another disclosed embodiment;

FIG. 17 is a side cross-sectional view of the flexible lighting device of FIG. 1 along the line V-V' in FIG. 2 according to still another disclosed embodiment;

FIG. 18 is a side cross-sectional view of the flexible lighting device of FIG. 1 along the line V-V' in FIG. 2 according to another disclosed embodiment;

FIGS. 19-24C are side cross-sectional views illustrating a manufacturing process of the flexible lighting device of FIGS. 6, 12, and 13 according to disclosed embodiments;

FIG. 26 is a flow chart showing a process of attaching a heat dispersion element to a first flexible substrate according to disclosed embodiments;

FIGS. 27A and 27B are flow charts showing a process of attaching a lighting element to conductive elements according to disclosed embodiments;

FIG. 28A-28C are flow charts showing a process of forming one or more top layers over the affixing material and the light-emitting element according to disclosed embodiments;

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Flexible Lighting Device Structure

Figure 1:
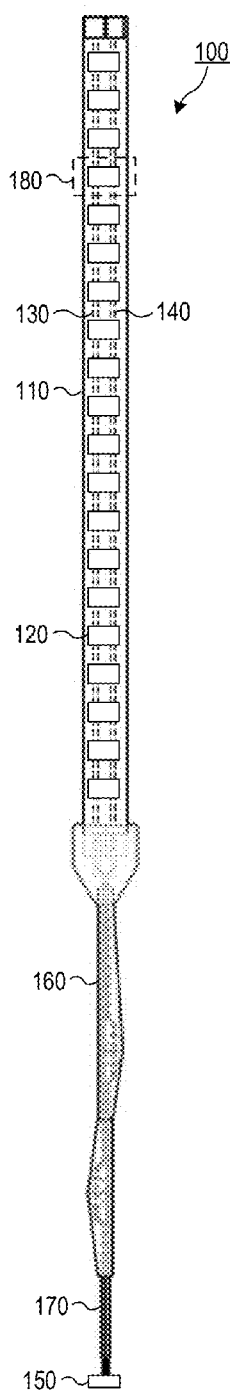
FIG. 1 is an overhead view of a flexible lighting device according to a disclosed embodiment.

FIG. 1 is an overhead view of a flexible lighting device 100 according to a disclosed embodiment. As shown in FIG. 1, the flexible lighting device 100 includes a flexible ribbon 110 containing a plurality of lighting elements 120, a positive conductive element 130, and a negative conductive element 140, a control circuit 150, a cable sheath 160, and a cable 170.

The flexible ribbon 110 serves to give structure and protection to the plurality of lighting elements 120 and the positive and negative conductive elements.

The plurality of lighting elements 120 operate to generate light based on currents received from the control circuit 150. In the disclosed embodiments, the lighting elements 120 contain light-emitting diodes (LEDs). In some embodiments the lighting elements 120 could be LEDs that emit light of a particular wavelength. In other embodiments the lighting elements 120 could be LEDs with phosphorus coatings that serve to scatter single-color light generated by the LEDs to make it white light. In still other embodiments the lighting elements 120 could be LEDs that include lenses to focus, diffuse, or color the light.

The positive conductive element 130 serves as a means for connecting one node of each of the plurality of lighting elements 120 to a positive voltage signal from the control circuit 150. Likewise, the negative conductive element 140 serves as a means for connecting another node of each of the plurality of lighting elements 120 to a negative voltage signal from the control circuit 150. In the alternative, the negative conductive element 140 may serve as a means for connecting the other node in each of the plurality of lighting elements 120 to a ground voltage. Where a negative voltage signal is referred to in this disclosure, it can also mean a ground voltage.

In the embodiment disclosed in FIG. 1, the positive and negative conductive elements 130, 140 are buss bars used to conduct current throughout the flexible lighting device 100. However, in alternate embodiments, the positive and negative conductive elements 130, 140 can be wires or any other structure that serves to electrically connect nodes of the plurality of lighting elements 120 to positive and negative voltage signals from the control circuit 150.

In alternate embodiments multiple positive conductive elements 130 and negative conductive element 140 could be provided so that different lighting elements 120 could be connected to different positive and negative conductive element 130, 140, thus allowing greater control of the operation of individual lighting elements 120.

The control circuit 150 provides positive and negative voltage signals across the positive and negative conductive elements 130, 140, respectively, in order to control the operation of the plurality of lighting elements 120. When the control circuit 150 supplies proper voltages to the positive and negative conductive elements 130, 140, the plurality of lighting elements 120 will turn on and emit light. When the control circuit 150 stops providing the proper voltages to the positive and negative conductive elements 130, 140, the plurality of lighting elements 120 will turn off and cease emitting light.

The cable sheath 160 serves to protect the cable 170 from damage, while the cable 170 provides power and control signals to the control circuit 150.

In operation, the control circuit 150 will either have a set pattern for operating the plurality of lighting elements 120, or will receive lighting control signals from an external source indicating how it should operate the plurality of lighting elements 120. Based on the set pattern or the lighting control signals, the control circuit 150 will provide appropriate voltages to the positive and negative conductive elements 130, 140 to activate the plurality of lighting elements 120 at desired times.

Figure 2:
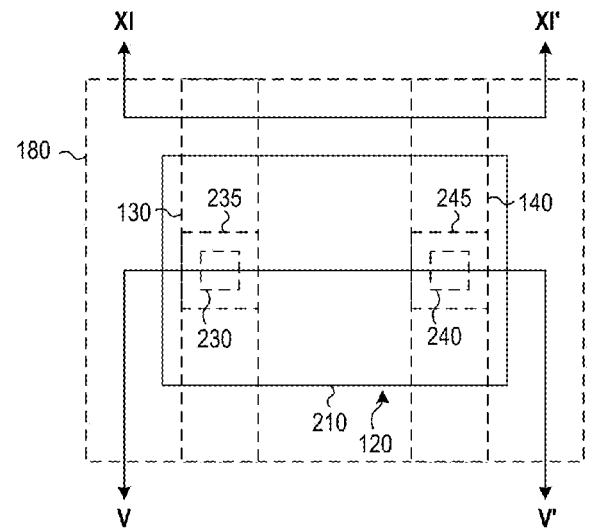
FIG. 2 is an overhead cross-sectional view of a single lighting element from the flexible lighting device of FIG. 1 according to disclosed embodiments.

FIG. 2 is an overhead cross-sectional window 180 of a single lighting element 120 from the flexible lighting device 100 of FIG. 1 according to disclosed embodiments. As shown in FIG. 2, the cross-sectional window 180 discloses that the lighting element 120 includes a light-emitting element 210, and the first and second contact elements 230 and 240 that are connected to the positive conductive element 130 and the negative conductive element 140, respectively, through first and second conductive connectors 235 and 245, respectively.

The light-emitting element 210 is a device configured to emit light, such as light of a specific wavelength (e.g., ultraviolet light, blue light, green light, infrared light, or any light with a wavelength between 10 nm and 100,000 nm) or light in a range of wavelengths (e.g., white light). In some embodiments the light-emitting elements 210 are LEDs that emit light of a particular wavelength; in other embodiments the light-emitting elements 210 are LEDs that emit light in a particular range of wavelengths; and in still other embodiments the light-emitting elements 210 are LEDs that include lenses to focus, diffuse, or color the light.

The first and second contact elements 230, 240 provide an external means for the light-emitting element 210 to be electrically connected to the positive and negative conductive element 130, 140. In the disclosed embodiments the first and second contact elements 230, 240 are contact pads. However, in alternate embodiments they could be any suitable means of electrically connecting the light-emitting element 210 with external elements. For example, in some alternate embodiments the first and second contact elements 230, 240 could be contact pins. When the light-emitting element 210 is an LED, the first contact element 230 is an anode, and the second contact element 240 is a cathode.

In the various disclosed embodiments, the first and second contact elements 230, 240 are provided on the same side of the light-emitting element 210. As a result of this, the light-emitting elements 210 can be connected to the positive and negative conductive elements 130, 140 with a minimum of connective circuitry, thereby minimizing the thickness of the light emitting elements 210, and therefore the thickness of the entire flexible lighting device 100. In one particular embodiment, the light-emitting element 210 is a flip-chip LED.

The first and second conductive connectors 235, 245 operate to electrically connect the lighting element 120 to the positive and negative conductive elements 130, 140. In particular, the first contact element 230 is connected to the positive conductive element 130 through the first conductive connector 235. Likewise, the second contact element 240 is connected to the negative conductive element 140 through the second conductive connector 245. In various embodiments, the conductive connectors 235, 245 can be: silver epoxy dots, a conductive adhesive, metal pads, daub pots, or other conductive metal elements.

Because the first and second contact elements 230, 240 are both formed on the same side of the light-emitting element 210, the first and second conductive connectors 235, 245 can likewise be placed on the same side of the light-emitting element 210. As a result, a relatively small connection distance is required to connect the first and second contact elements 230, 240 to the positive and negative conductive elements 130, 140. This allows for a thinner lighting element 120, as compared to a lighting element that employs a light-emitting element with contact elements formed on opposite sides of the light-emitting element.

Figure 3:
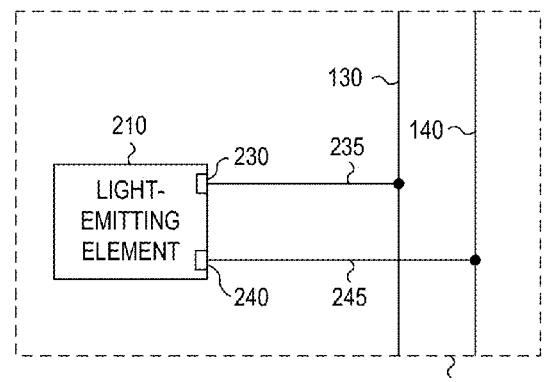
FIG. 3 is a circuit diagram showing the electrical connections of the single lighting element of FIG. 2 according to disclosed embodiments.

FIG. 3 is a circuit diagram showing the electrical connections of the lighting element 120 in the cross-sectional window 180 of FIG. 2 according to disclosed embodiments. As shown in FIG. 3, the light-emitting element 210 is electrically connected to the positive conductive element 130 through its first contact element 230, and the first conductive connector 235. Similarly, the light-emitting element 210 is electrically connected to the negative conductive element 140 through its second contact element 240 and the second conductive connector 245.

Figure 4:
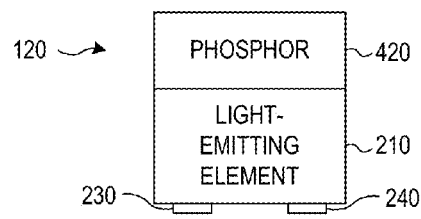
FIG. 4 is a side cross-sectional view of the single lighting element of FIG. 2 according to a disclosed embodiment.

FIG. 4 is a side cross-sectional view of the lighting element 120 of FIG. 2 according to a disclosed embodiment. As shown in FIG. 4, the lighting element 120 in this embodiment includes a light-emitting element 210 having first and second contact elements 230, 240, and a phosphor layer 420 located over the light-emitting element 210.

The light-emitting element 210, and the first and the second contact elements 230, 240, operate as described above. As a result, the description will not be repeated here.

The phosphor layer 420 operates to scatter light emitted from the top surface of the light-emitting element 210. When the light emitted by the light-emitting element 210 is within the wavelength spectrum between ultraviolet and blue light (i.e., from about 10 nm to 490 nm), the phosphor layer 420 scatters the emitted light such that it becomes white light. In this way, when the light-emitting elements 210 is a light-emitting diode (LED) that emits light of a single wavelength, the resulting lighting element 120 can generate white light. For this reason, many manufacturers of LEDs will manufacture blue- or ultraviolet-emitting diodes that includes a phosphor layer 420 already applied to the light-emitting surface of the LED. In alternate embodiments the lighting element 120 can be formed without the phosphor layer 420.

Flexible Lighting Device with Second Flexible Substrate

Figures 5, 6:
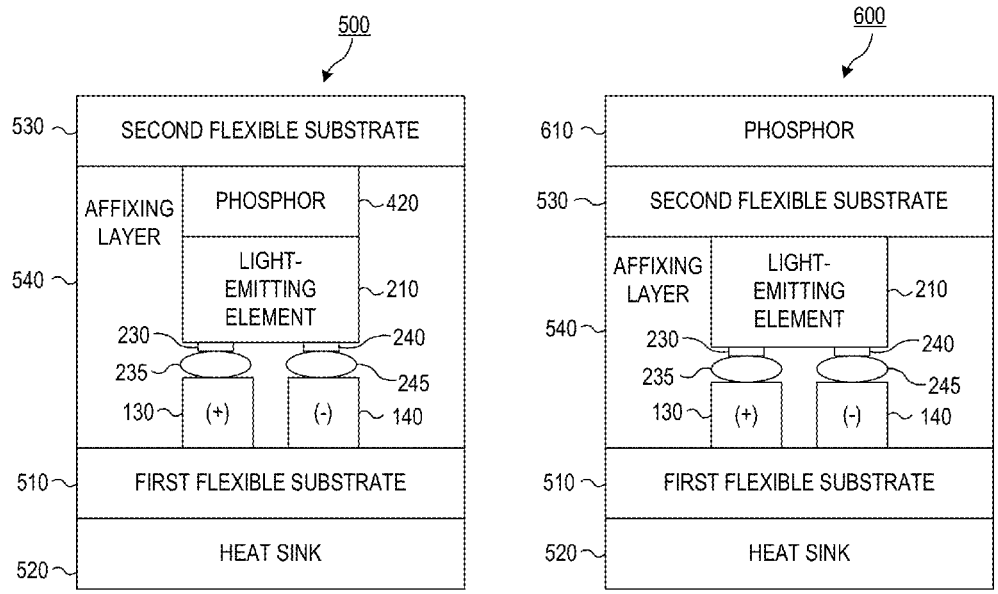
FIG. 5 is a side cross-sectional view of the flexible lighting device of FIG. 1 along the line V-V' according to a disclosed embodiment.
FIG. 6 is a side cross-sectional view of the flexible lighting device of FIG. 1 along the line V-V' in FIG. 2 according to another disclosed embodiment.

FIG. 5 is a side cross-sectional view of the flexible lighting device 500 of FIG. 1 along the line V-V' in FIG. 2 according to a disclosed embodiment. As shown in FIG. 5, the flexible lighting device 500 includes a first flexible substrate 510, a heat sink 520, positive and negative conductive elements 130, 140, a light-emitting element 210, a phosphor layer 420, first and second contact elements 230, 240, first and second conductive connectors 235, 245, a second flexible substrate 530, and an affixing layer 540.

The first flexible substrate 510 serves as a base for the remainder of the flexible lighting device 500. As a reference direction, the first flexible substrate 510 can be considered to be a "bottom" substrate upon which the other elements are stacked. However, this is as a point of reference only. The flexible lighting device 500 has no inherent direction, and can be oriented in any manner, even with the first flexible substrate 510 being on the "top" of the structure.

The first flexible substrate 510 can be made of polyethylene terephthalate (PET), polyethylene napthalate (PEN), polyester, a polymer, an oxide-coated polymer, a flexible plastic, a metal-coated flexible plastic, or any suitable flexible material. The first flexible substrate 510 should be flexible, since the entire flexible lighting device 500 needs to be flexible. Because light does not shine out of the first flexible substrate 510, it is not necessary for the first flexible substrate 510 to be transparent to light.

The heat sink 520 is attached to the bottom of the first flexible substrate 510 (i.e., the side opposite the side on which the remainder of elements are located), and operates to dissipate heat from the lighting element 120. The heat sink 520 can be a flexible metal layer (e.g., a metal tape), a flexible ceramic thin-film layer, or any flexible material that dissipates heat sufficiently. Although FIG. 5 discloses the use of a heat sink 520, alternate embodiments can omit the heat sink 520.

The positive and negative conductive elements 130, 140 are located on an opposite side of the first flexible substrate 510 from the heat sink 520 (if any). Each is made of a conductive material that is connected to the control circuit 150, and is configured to carry a control current generated by the control circuit 150. As noted above, in the embodiment disclosed in FIGS. 1 to 5, the positive and negative conductive elements 130, 140 are buss bars used to conduct electricity throughout the flexible lighting device 100. In alternate embodiments the positive and negative conductive elements 130, 140 could be wires or any other conductive structure that can pass current to the lighting elements 120.

The first and second conductive elements 130, 140 may be made of copper, silver, aluminum, or any suitable conductive metal or conductive oxide. Because the flexible lighting device 100 must remain flexible, the first and second conductive elements 130, 140 should also be configured such that they can bend without breaking or losing their ability to carry a current.

The light-emitting element 210 is configured to generate light based on the control current carried on the first and second conductive elements 130, 140. One exemplary light-emitting element 210 used in the disclosed embodiments is a light-emitting diode (LED). An LED has an anode (i.e., a positive side) and a cathode (i.e., a negative side), and operates to generate light of a specific wavelength (from infrared to ultraviolet, i.e., having a wavelength from 10 nm to 100,000 nm) when current flows through the LED from the anode to the cathode.

The phosphor layer 420 is located on the light-emitting element 210 and operates to shift the light generated by the light-emitting element 210 from a single color (i.e., having a narrow range of wavelengths) to white light (i.e., having a wide range of wavelengths). Typically, this requires a light-emitting element 210 that generates light in the ultraviolet to blue spectrum (i.e. having a wavelength between about 10 nm to 490 nm). In embodiments in which the light-emitting element 210 is designed to emit a single color of light, the phosphor layer 420 can be omitted. White light LEDs coated with a phosphor layer are generally available for purchase from a variety of suppliers. As a result, it is possible to obtain an LED already coded with a phosphor layer for a manufacturing process. As noted previously, the phosphor layer 420 can be eliminated in embodiments in which the light emitting elements 120 need only emit light of a single wavelength.

The first and second contact elements 230, 240 are formed on the light-emitting element 210 and operate to connect the light-emitting element 210 to external elements (i.e., the positive and negative conductive elements 130, 140 in this embodiment). When the light-emitting element 210 is an LED, the first contact element 230 is connected to the anode of the LED, and the second contact element 240 is connected to the cathode of the LED.

The first and second conductive connectors 235, 245 operate to electrically connect the lighting element 120 to the positive and negative conductive elements 130, 140. In particular, the first contact element 230 is connected to the positive conductive element 130 through the first conductive connector 235. Likewise, the second contact element 240 is connected to the negative conductive element 140 through the second conductive connector 245. Thus, when the light-emitting element 210 is an LED, the first conductive connector 235 is configured to connect the anode of the LED to the positive conductive element 130 (i.e., the first conductive connector 235), while the second conductive connector 245 is configured to connect the cathode of the LED to the negative conductive element 140 (i.e., the second conductive connector 245). In various embodiments, the conductive connectors 235, 245 can be: silver epoxy dots, a conductive adhesive, metal pads, or other conductive metal elements.

The second flexible substrate 530 is located over the phosphor layer 420 (if any) (i.e., over the lighting element 120) and serves to protect the lighting element 120 and to give the flexible lighting device 500 structure. As a reference direction, the second flexible substrate 530 can be considered to be a "top" substrate that covers the other elements stacked on the first flexible substrate 510. However, this is by way of reference only. The flexible lighting device 500 has no inherent direction, and can be oriented in any manner, even with the second flexible substrate 530 being on the "bottom" of the structure.

In some embodiments, the second flexible substrate 530 can operate as a lens. In such embodiments, the entire second flexible substrate 530, or simply portions of the second flexible substrate over the lighting elements 120 are formed into integral lenses. These lenses could be provided for a variety of purposes. They could operate to focus the light emitted from the light-emitting elements 210 in order to increase light output by allowing light to be emitted perpendicular to the surface of the second flexible substrate 530; they could act to diffuse light emitted from the light-emitting elements 210 to allow light to be emitted at a larger angle of incidence from the light-emitting element 210; or they could be colored lenses that act to color the light emitted from the light-emitting elements 210.

The second flexible substrate 530 can be made of polyethylene terephthalate (PET), polyethylene napthalate (PEN), polyester, a polymer, an oxide-coated polymer, a flexible plastic, a metal-coated flexible plastic, or any suitable flexible material. The second flexible substrate 530 should be flexible, since the entire flexible lighting device 500 needs to be flexible. Furthermore, because light will shine from the light-emitting elements 210 out through the second flexible substrate 530, the second flexible substrate 530 should be substantially transparent to the wavelengths of light that are emitted from the light-emitting element 210.

The affixing layer 540 is located between the first and second flexible substrates 510, 530 and around the lighting element 120, and is configured to fix the lighting element 120 in place and to affix the first and second flexible substrates 510, 530 together. Because light from the light-emitting element 210 may need to pass through the affixing layer 540, it is generally desirable that the affixing layer also be substantially transparent to the wavelengths of light that are emitted from the light-emitting element 210.

Use of a Phosphor Layer and a Lens

Figures 7, 8:
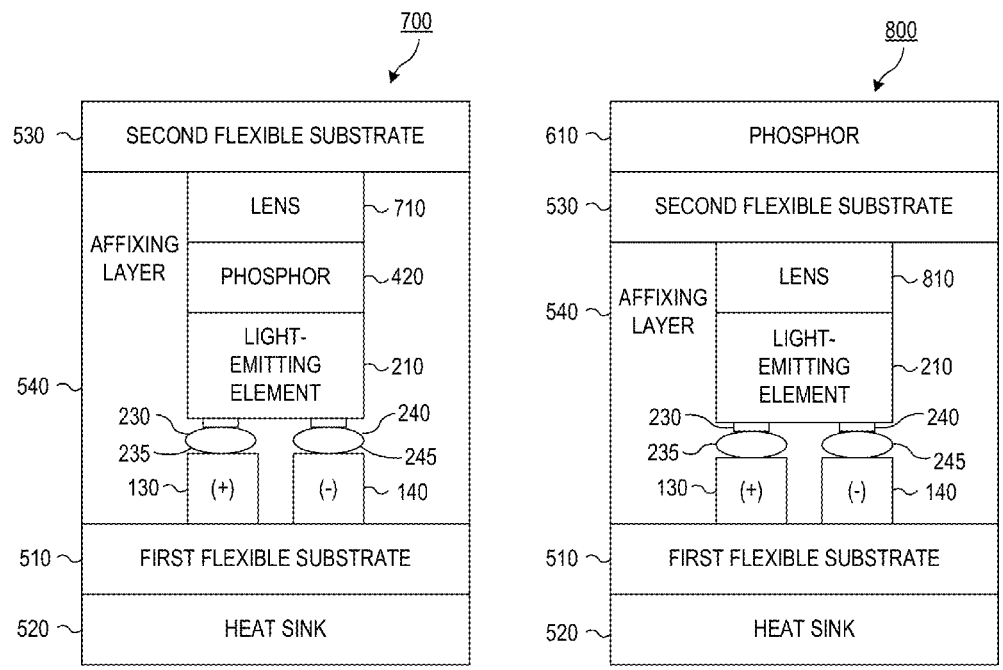
FIG. 7 is a side cross-sectional view of the flexible lighting device of FIG. 1 along the line V-V' in FIG. 2 according to still another disclosed embodiment.
FIG. 8 is a side cross-sectional view of the flexible lighting device of FIG. 1 along the line V-V' in FIG. 2 according to yet another disclosed embodiment.

FIGS. 6-8 show alternate embodiments of the lighting elements 210 of FIGS. 2-4 above. These alternate embodiments disclose the use of either or both of a phosphor layer and a lens.

FIG. 6 is a side cross-sectional view of the flexible lighting device 600 of FIG. 1 along the line V-V' in FIG. 2 according to another disclosed embodiment. As shown in FIG. 6, the flexible lighting device 600 includes a first flexible substrate 510, a heat sink 520, first and second conductive elements 130, 140, a light-emitting element 210, first and second contact elements 230, 240, first and second conductive connectors 235, 245, a second flexible substrate 530, an affixing layer 540, and a phosphor layer 610.

In FIG. 6, the first flexible substrate 510, the heat sink 520, the first and second conductive elements 130, 140, the light-emitting element 210, the first and second contact elements 230, 240, the first and second conductive connectors 235, 245, the second flexible substrate 530, and the affixing layer 540 operate as disclosed above with respect to FIG. 5. Therefore, a description of these elements will not be repeated for this embodiment.

The embodiment of FIG. 6 differs from the embodiment of FIG. 5 in that it includes a phosphor layer 610 on top of the second flexible substrate 530 rather than on top of the light-emitting element 210. The phosphor layer 610 is similar in configuration and operation to the phosphor layer 420 in the embodiment FIG. 5, save for its location. It operates to scatter light emitted from the light-emitting element 210 such that it is converted from light in a single wavelength (e.g., light having a wavelength between 10 nm and 490 nm) to light in a broad distribution of wavelengths (e.g., white light) or light of narrow wavelengths distribution of lower energy (e.g., green to red).

FIG. 7 is a side cross-sectional view of the flexible lighting device 700 of FIG. 1 along the line V-V' in FIG. 2 according to still another disclosed embodiment. As shown in FIG. 7, the flexible lighting device 700 includes a first flexible substrate 510, a heat sink 520, first and second conductive elements 130, 140, a light-emitting element 210, a phosphor layer 420, a lens 710, first and second contact elements 230, 240, first and second conductive connectors 235, 245, a second flexible substrate 530, and an affixing layer 540.

In FIG. 7, the first flexible substrate 510, the heat sink 520, the first and second conductive elements 130, 140, the light-emitting element 210, the phosphor layer 420, the first and second contact elements 230, 240, the first and second conductive connectors 235, 245, the second flexible substrate 530, and the affixing layer 540 operate as disclosed above with respect to FIG. 5. Therefore, a description of these elements will not be repeated for this embodiment.

The embodiment of FIG. 7 differs from the embodiment of FIG. 5 in that it includes a lens 710 on top of the phosphor layer 420. The lens 710 could be provided for a variety of purposes. It could operate to focus the light emitted from the light-emitting element 210 in order to allow the light to be emitted perpendicular to the surface of the second flexible substrate 530; it could act to diffuse light emitted from the light-emitting element 210 to allow light to be emitted at a larger angle of incidence from the light-emitting element 210; or it could be a colored lens that acts to color the light emitted from the light-emitting element 210.

Although the lens 710 in FIG. 7 is shown to be of a similar width to the light-emitting elements 210, it can vary in width such that it may overhang the light-emitting element 210. Some LED manufacturers offer LEDs with integrated lenses, allowing for easier construction of the light emitting device 600 of FIG. 6.

Furthermore, although FIG. 7 discloses both a lens 710 and a phosphor layer 420, the phosphor layer 420 could be eliminated in alternate embodiments in which only light of a narrow range of wavelengths is needed.

FIG. 8 is a side cross-sectional view of the flexible lighting device 800 of FIG. 1 along the line V-V' in FIG. 2 according to yet another disclosed embodiment. As shown in FIG. 8, the flexible lighting device 800 includes a first flexible substrate 510, a heat sink 520, first and second conductive elements 130, 140, a light-emitting element 210, a lens 810, first and second contact elements 230, 240, first and second conductive connectors 235, 245, a second flexible substrate 530, an affixing layer 540, and a phosphor layer 610.

In FIG. 8, the first flexible substrate 510, the heat sink 520, the first and second conductive elements 130, 140, the light-emitting element 210, the first and second contact elements 230, 240, the first and second conductive connectors 235, 245, the second flexible substrate 530, the affixing layer 540 and the phosphor layer 610 operate as disclosed above with respect to FIGS. 5 and 6. Therefore, a description of these elements will not be repeated for this embodiment.

The embodiment of FIG. 8 differs from the embodiments of FIGS. 5 to 7 in that it includes a lens 810 over the light-emitting elements 210, and a phosphor layer 610 over the second flexible substrate 530. The lens 810 functions similarly in configuration and operation to the lens 710 in FIG. 7.

Although FIG. 8 discloses both a lens 810 and a phosphor layer 610, the phosphor layer 610 could be eliminated in alternate embodiments in which only light of a narrow range of wavelengths is needed.

Figure 9:
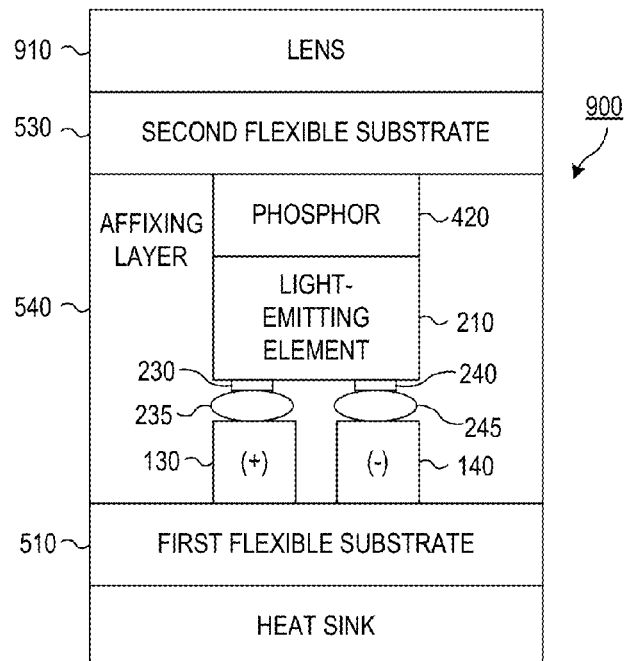
FIG. 9 is a side cross-sectional view of the flexible lighting device of FIG. 1 along the line V-V' in FIG. 2 according to another disclosed embodiment.

FIG. 9 is a side cross-sectional view of the flexible lighting device of FIG. 1 along the line V-V' in FIG. 2 according to another disclosed embodiment. As shown in FIG. 9, the flexible lighting device 900 includes a first flexible substrate 510, a heat sink 520, first and second conductive elements 130, 140, a light-emitting element 210, a phosphor layer 420, first and second contact elements 230, 240, first and second conductive connectors 235, 245, a second flexible substrate 530, an affixing layer 540, and a lens 810.

In FIG. 9, the first flexible substrate 510, the heat sink 520, the first and second conductive elements 130, 140, the light-emitting element 210, the phosphor layer 420, the first and second contact elements 230, 240, the first and second conductive connectors 235, 245, the second flexible substrate 530, and the affixing layer 540 operate as disclosed above with respect to FIG. 5. Therefore, a description of these elements will not be repeated for this embodiment.

The embodiment of FIG. 9 differs from the embodiments of FIGS. 5 and 7 in that it includes a lens 910 over the second flexible substrate 530, and a phosphor layer 420 over the light-emitting element 210. As noted above with respect to FIG. 5, the lens can also be a part of or imbedded in the second substrate 530. Aside from its location on the second flexible substrate 530, the lens 910 functions similarly in configuration and operation to the lens 710 in the embodiment of FIG. 7.

Figure 10:
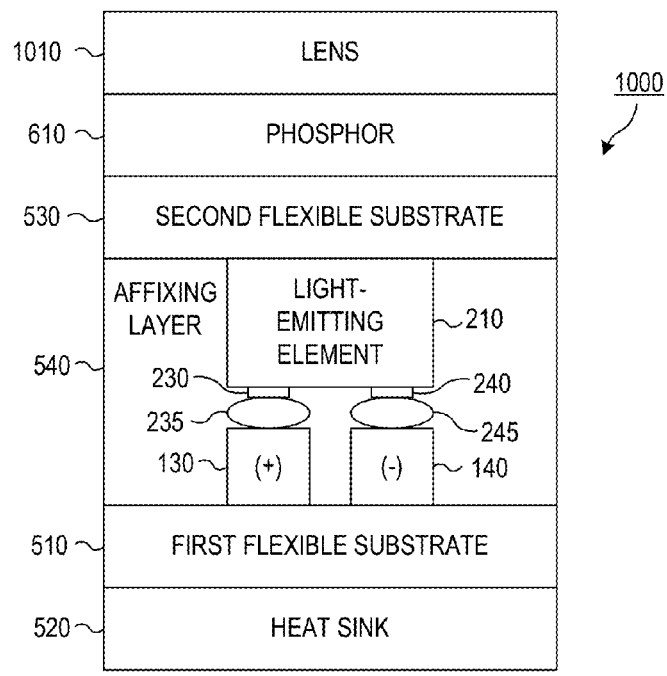
FIG. 10 is a side cross-sectional view of the flexible lighting device of FIG. 1 along the line V-V' in FIG. 2 according to still another disclosed embodiment.

FIG. 10 is a side cross-sectional view of the flexible lighting device 1000 of FIG. 1 along the line V-V' in FIG. 2 according to still another disclosed embodiment. As shown in FIG. 10, the flexible lighting device 1000 includes a first flexible substrate 510, a heat sink 520, first and second conductive elements 130, 140, a light-emitting element 210, first and second contact elements 230, 240, first and second conductive connectors 235, 245, a second flexible substrate 530, an affixing layer 540, a phosphor layer 610, and a lens 1010.

In FIG. 10, the first flexible substrate 510, the heat sink 520, the first and second conductive elements 130, 140, the light-emitting element 210, the first and second contact elements 230, 240, the first and second conductive connectors 235, 245, the second flexible substrate 530, the affixing layer 540 and the phosphor layer 610 operate as disclosed above with respect to FIGS. 5 and 6. Therefore, a description of these elements will not be repeated for this embodiment.

The embodiment of FIG. 10 differs from the embodiments of FIGS. 5, 6, and 8 in that it includes a lens 1010 and a phosphor layer 610 over or as a part of the second flexible substrate 530. The lens 1010 functions similarly in configuration and operation to the lens 910 in the embodiment of FIG. 9.

Use of Heat Sinks and Heat Spreaders

FIGS. 11A-14 show alternate embodiments of the flexible lighting device 100 of FIG. 1 according to alternate disclosed embodiments. These alternate embodiments vary the formation of a heat dissipation structure on the flexible lighting device 100.

Figure 11A:
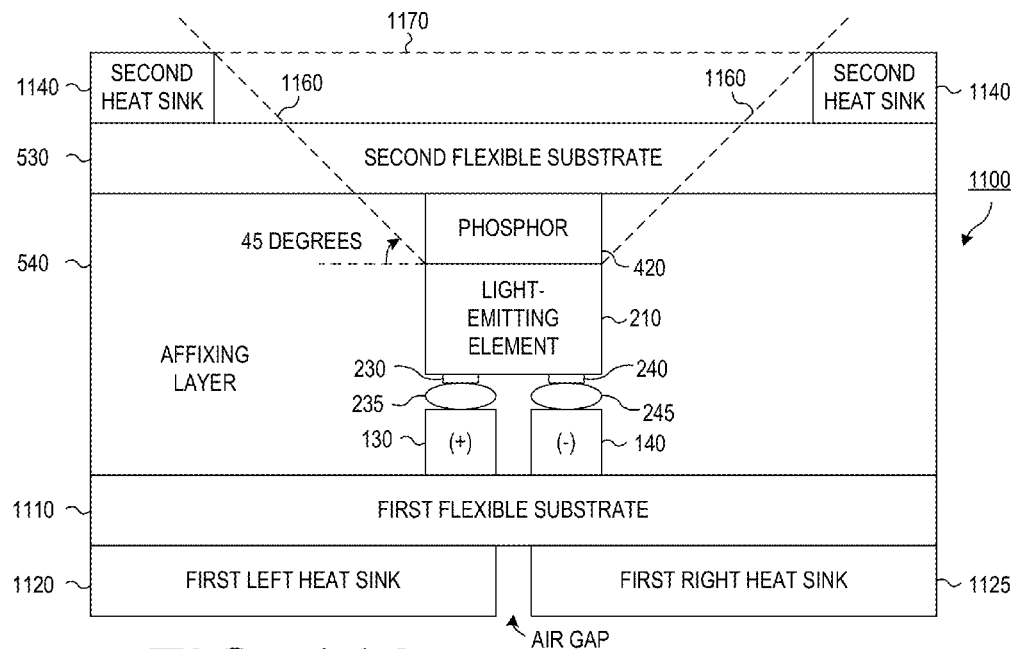
FIGS. 11A and 11B are a side cross-sectional views of the flexible lighting device of FIG. 1 along the line V-V' and XI-XI', respectively in FIG. 2 according to yet another disclosed embodiment.
Figure 11B:
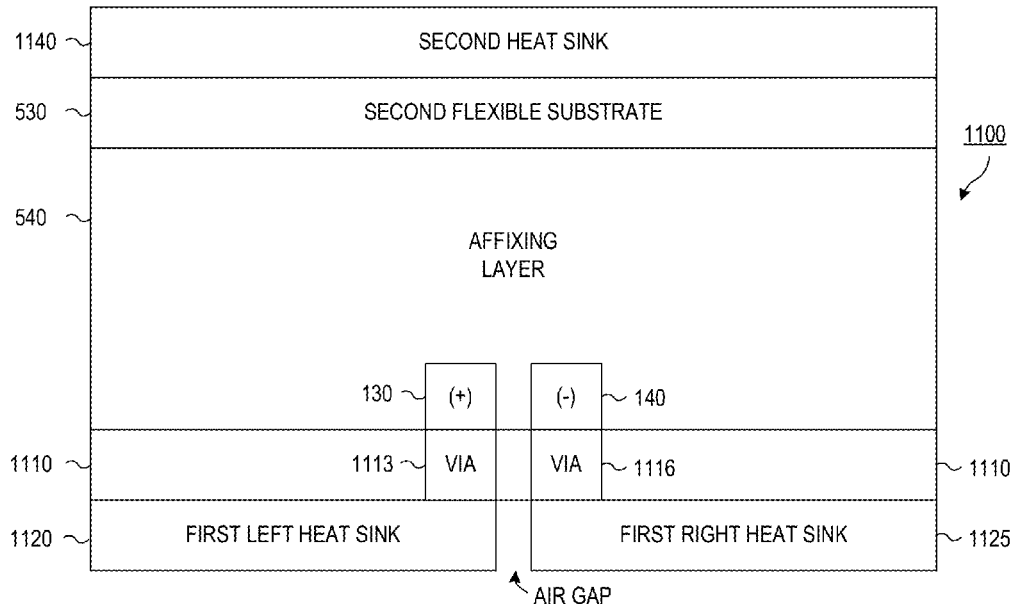

FIG. 11A is a side cross-sectional view of the flexible lighting device 1100 of FIG. 1 along the line V-V' in FIG. 2 according to yet another disclosed embodiment, while FIG. 11B is a side cross-sectional view of the flexible lighting device 1100 of FIG. 1 along the line XI-XI' in FIG. 2 according to the yet another disclosed embodiment. As shown in FIGS. 11A and 11B, the flexible lighting device 1100 includes a first flexible substrate 1110, a first left heat sink 1120, a first right heat sink 1125, first and second conductive elements 130, 140, a light-emitting element 210, a phosphor layer 420, first and second contact elements 230, 240, first and second conductive connectors 235, 245, a second flexible substrate 530, a second heat sink 1140, and an affixing layer 540.

In FIGS. 11A and 11B, the first and second conductive elements 130, 140, the light-emitting element 210, the phosphor layer 420, the first and second contact elements 230, 240, the first and second conductive connectors 235, 245, the second flexible substrate 530, and the affixing layer 540 operate as disclosed above with respect to FIG. 5. Therefore, a description of these elements will not be repeated for this embodiment.

As shown in FIG. 11B, the first flexible substrate 1110 is similar in configuration and composition to the first flexible substrate 510 in the embodiment of FIG. 5, save that it includes a plurality of first vias 1113 and a plurality of second vias 1116 passing through it. fixed locations, the first and second vias being filled with a conductive material or any suitable material with a thermal conductance high enough to efficiently pass heat between the positive and negative conductive elements 130, 140 and the first left and right heat sinks 1120, 1125. By way of example, the thermal conductance of the first and second vias 1113, 1116 should be at least 0.24 W/m-K.

As shown in FIG. 11B, the first vias 1113 connect the positive conductive element 130 to the first left heat sink 1120, while the second vias 1116 connect the negative conductive element 140 to the first right heat sink 1125. In this embodiment the first and second vias 1113, 1116 are located in a portion of the flexible lighting device 100 such that they are not directly underneath the lighting elements 120. However, in alternate embodiments they could be located underneath the lighting elements 120.

As shown in FIGS. 11A and 11B, the first left heat sink 1120 and the first right heat sink 1125 are similar in configuration and composition to the heat sink 520 in the embodiment of FIG. 5, save that each only covers approximately half of the first flexible substrate 1110 (there is a small air gap between then to provide insulation), and that each contacts the conductive material in the vias 1113, 1116 they are secured to the first flexible substrate 1110. In particular, the first via 1113 contacts the first left heat sink 1120 and the second via 1116 contacts the first right heat sink 1125. The terms right and left when used to identify the heat sinks 1120, 1125 are used solely as a means of reference, and not to limit them to any one position.

As shown in FIG. 11A, the second heat sink 1140 is similar in configuration and composition to the first heat sink 1120, save that it is located on the second flexible substrate 1130. Furthermore, the second heat sink 1140 is configured such that it has gaps 1170 in the areas over the lighting elements 120. In particular, in this embodiment, the second heat sink is not formed for an area defined by lines 1160, 45° above the surface of the light-emitting elements 210, extending out in all directions from the outer top circumference of the light-emitting elements 210.

In alternate embodiments, the first left heat sink 1120 and the first right heat sink 1125 can be the same heat sink. For example, a single heat sink could be used that was a closed polygon (e.g., a closed circle or a closed rectangle) having an open space opposite the light-emitting element 210 as the air gap.

In alternate embodiments, the flexible lighting device 1100 could eliminate the first and second vias 1113, 1116, and allow heat to be dissipated simply by the first and second heat sinks 1120, 1125. Furthermore, any of the embodiments described above with respect to FIGS. 5 to 10 could be modified to include first left and right heat sinks 1120, 1125 and first and second vias 1113, 1116 connecting the positive conductive element 130 to the first left right heat sink 1120, and the negative conductive element 140 to the first right heat sink 1125.

Figure 12:
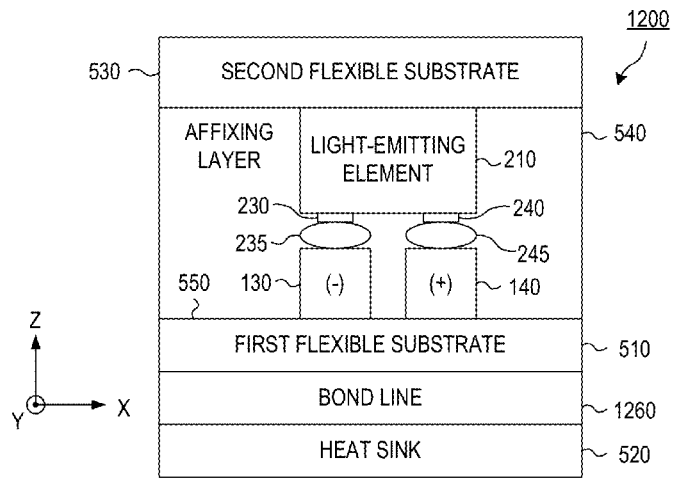
FIG. 12 is a side cross-sectional view of the flexible lighting device of FIG. 1 along the line V-V' in FIG. 2 according to yet another disclosed embodiment.

FIG. 12 is a side cross-sectional view of an upper portion of the flexible lighting device of FIG. 1 along the line V-V' in FIG. 2 according to another disclosed embodiment. As shown in FIG. 12, the flexible lighting device 1200 includes a first flexible substrate 510, a bond line 1260, a heat sink 520, first and second conductive elements 130, 140, a light-emitting element 210, first and second contact elements 230, 240, first and second conductive connectors 235, 245, a second flexible substrate 530, and an affixing layer 540.

In FIG. 12, the first flexible substrate 510, the first and second conductive elements 130, 140, the light-emitting element 210, the first and second contact elements 230, 240, the first and second conductive connectors 235, 245, the second flexible substrate 530, and the affixing layer 540 operate as disclosed above with respect to FIG. 5. Therefore, a description of these elements will not be repeated for this embodiment.

The embodiment of FIG. 12 differs from the embodiment of FIG. 5 in that it includes a bond line 1260 between the first flexible substrate 510 and the heat sink 520. The bond line 1260 serves to attach the heat sink 520 to the first flexible substrate 510. The bond line 1260 is also configured to pass heat from the first flexible substrate 510 to the heat sink 520. In various embodiments, the bond line 1260 can be an electrically isolating or electrically conducting thermal adhesive tape, e.g., a metal filled thermal tape.

The heat sink 520 is attached to the bottom of the first flexible substrate 510 (i.e., the side opposite the side on which the remainder of elements are located) by the bond line 1260, and operates to dissipate heat generated by the lighting element 120. In particular, the heat sink 520 is configured to pass heat primarily in a Z-direction, i.e. in a direction from the first flexible substrate out into open air.

The heat sink 520 can be a flexible metal layer (e.g., a metal tape), a flexible ceramic thin-film layer, any flexible material or carbon-based film that dissipates heat sufficiently.

Figure 13:
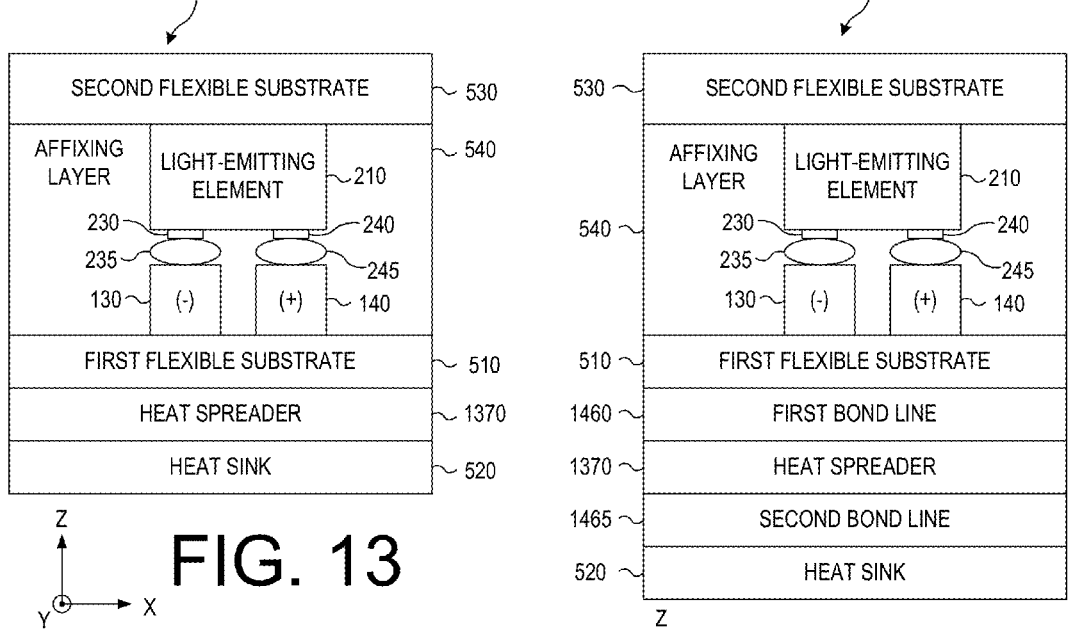
FIG. 13 is a side cross-sectional view of the flexible lighting device of FIG. 1 along the line V-V' in FIG. 2 according to another disclosed embodiment.

FIG. 13 is a side cross-sectional view of an upper portion of the flexible lighting device of FIG. 1 along the line V-V' in FIG. 2 according to still another disclosed embodiment. As shown in FIG. 13, the flexible lighting device 1300 includes a first flexible substrate 510, a heat spreader 1370, a heat sink 520, first and second conductive elements 130, 140, a light-emitting element 210, first and second contact elements 230, 240, first and second conductive connectors 235, 245, a second flexible substrate 530, and an affixing layer 540.

In FIG. 13, the first flexible substrate 510, the first and second conductive elements 130, 140, the light-emitting element 210, the first and second contact elements 230, 240, the first and second conductive connectors 235, 245, the second flexible substrate 530, and the affixing layer 540 operate as disclosed above with respect to FIG. 5. Therefore, a description of these elements will not be repeated for this embodiment.

The embodiment of FIG. 13 differs from the embodiment of FIG. 5 in that it includes a heat spreader 1370 attached between the first flexible substrate 510 and the heat sink 520. The heat spreader 1370 serves to dissipate heat in the X- and Y-directions, i.e. in directions parallel to a surface of the first flexible substrate 510 and a surface of the heat sink 520. In doing so, the heat spreader 1370 can spread the heat generated by the light-emitting elements 210 such that it is not concentrated directly underneath the light-emitting elements 210. In various embodiments, the heat spreader 1370 can be made of thin layers of metal, films of carbon based organized structures (e.g., graphite) or composites of metal and low glass transition polymers.

The heat sink 520 is attached to the bottom of the heat spreader 1370 (i.e., on the side of the first flexible substrate 510 opposite the side on which the remainder of elements are located). The heat sink 520 operates to dissipate heat generated by the lighting element 120. In particular, the heat sink 520 is configured to pass heat primarily in a Z-direction, i.e. in a direction from the first flexible substrate out into open air. However, because the heat spreader 1370 spreads the heat generated by the lighting element 120 in the X- and Y-directions, the heat sink 520 can operate more efficiently.

Figure 14:
FIG. 14 is a side cross-sectional view of the flexible lighting device of FIG. 1 along the line V-V' in FIG. 2 according to another disclosed embodiment.

FIG. 14 is a side cross-sectional view of the flexible lighting device of FIG. 1 along the line V-V' in FIG. 2 according to yet another disclosed embodiment. As shown in FIG. 14, the flexible lighting device 1400 includes a first flexible substrate 510, a first bond line 1460, a heat spreader 1370, a second bond line 1465, a heat sink 520, first and second conductive elements 130, 140, a light-emitting element 210, first and second contact elements 230, 240, first and second conductive connectors 235, 245, a second flexible substrate 530, and an affixing layer 540.

In FIG. 14, the first flexible substrate 510, the heat spreader 1370, the heat sink 520, the first and second conductive elements 130, 140, the light-emitting element 210, the first and second contact elements 230, 240, the first and second conductive connectors 235, 245, the second flexible substrate 530, and the affixing layer 540 operate as disclosed above with respect to FIG. 13. Therefore, a description of these elements will not be repeated for this embodiment.

The embodiment of FIG. 14 differs from the embodiment of FIG. 13 in that it includes a first bond line 1460 between the first flexible substrate 510 and the heat spreader 1370, and a second bond line 1465 between the heat spreader 1370 and the heat sink 520. The first bond line 1460 serves to attach the heat spreader 1370 to the first flexible substrate 510, while the second bond line 1465 searched to attach the heat sink 520 to the heat spreader 1370. The first and second bond lines 1460, 1465 are also configured to pass heat, from the first flexible substrate 510 to the heat spreader 1370, and from the heat spreader 1370 to the heat sink 520. In various embodiments, the first and second bond lines 1460, 1465 can be an electrically isolating or electrically conducting thermal adhesive tape, e.g., a metal filled thermal tape.

Use of a Top Conformal Layer

FIGS. 15-18 show alternate embodiments of the flexible lighting device 100 of FIG. 1 according to alternate disclosed embodiments. These alternate embodiments disclose the use of a top conformal layer in place of a second flexible substrate.

FIG. 15 is a side cross-sectional view of the flexible lighting device of FIG. 1 along the line V-V' in FIG. 2 according to another disclosed embodiment. As shown in FIG. 15, the flexible lighting device 1500 includes a first flexible substrate 510, a heat sink 520, first and second conductive elements 130, 140, a light-emitting element 210, first and second contact elements 230, 240, first and second conductive connectors 235, 245, an affixing layer 540, and a conformal layer with a phosphor 1565.

In FIG. 15, the first flexible substrate 510, the heat sink 520, the first and second conductive elements 130, 140, the light-emitting element 210, the first and second contact elements 230, 240, the first and second conductive connectors 235, 245, and the affixing layer 540 operate as disclosed above with respect to FIG. 5. Therefore, a description of these elements will not be repeated for this embodiment.

The embodiment of FIG. 15 differs from the embodiments of FIG. 5 in that it uses a conformal layer with a phosphor 1565 instead of a second flexible substrate 530 and phosphor layer 420. The conformal layer 1565 is deposited in a viscous form and is then hardened, e.g., using heat or ultraviolet radiation.

As noted above, the conformal layer 1565 includes a phosphor. This allows the flexible lighting device 1500 to produce white light. However, in embodiments in which light of only a single color is needed, a conformal layer without phosphor can be used in place of the conformal layer with phosphor 1565.

FIG. 16 is a side cross-sectional view of an upper portion of the flexible lighting device of FIG. 1 along the line V-V' according to still another disclosed embodiment. As shown in FIG. 16, the flexible lighting device 1600 includes a first flexible substrate 510, a heat sink 520, first and second conductive elements 130, 140, a light-emitting element 210, first and second contact elements 230, 240, first and second conductive connectors 235, 245, an affixing layer 540, a conformal layer with phosphor 1670, and a conformal layer without phosphor 1675.

In FIG. 16, the first flexible substrate 510, the heat sink 520, the first and second conductive elements 130, 140, the light-emitting element 210, the first and second contact elements 230, 240, the first and second conductive connectors 235, 245, and the affixing layer 540 operate as disclosed above with respect to FIG. 5. Therefore, a description of these elements will not be repeated for this embodiment.

The embodiment of FIG. 16 differs from the embodiments of FIG. 5 in that it uses a conformal layer without phosphor 1675 instead of a second flexible substrate 530, and in that it employs a conformal layer with phosphor 1670 over the light-emitting elements 210. Both the conformal layer with phosphor 1670 and the conformal layer without phosphor 1675 are deposited in a viscous form and then hardened, e.g., using heat or ultraviolet radiation.

The conformal layer with phosphor 1670 is formed only over the light-emitting elements 210, while the conformal layer without phosphor is formed over the entire structure. This allows the flexible lighting device 1600 to produce white light, without requiring a quantity of phosphor to be mixed in with a conformal layer that must cover the entire structure.

FIG. 17 is a side cross-sectional view of an upper portion of the flexible lighting device of FIG. 1 along the line V-V' according to yet another disclosed embodiment. As shown in FIG. 17, the flexible lighting device 1700 includes a first flexible substrate 510, a heat sink 520, first and second conductive elements 130, 140, a light-emitting element 210, a lens 710, first and second contact elements 230, 240, first and second conductive connectors 235, 245, an affixing layer 540, a conformal layer with phosphor 1565.

In FIG. 17, the first flexible substrate 510, the heat sink 520, the first and second conductive elements 130, 140, the light-emitting element 210, the lens 710, the first and second contact elements 230, 240, the first and second conductive connectors 235, 245, the affixing layer 540, and the conformal layer with phosphor 1565 operate as disclosed above with respect to FIGS. 5, 8, and 15. Therefore, a description of these elements will not be repeated for this embodiment.

The embodiment of FIG. 17 differs from the embodiments of FIGS. 5, 8, and 15 in that it uses a conformal layer with phosphor 1565 instead of a second flexible substrate 530, and in that it employs a lens 710 over the light-emitting elements 210.

FIG. 18 is a side cross-sectional view of an upper portion of the flexible lighting device of FIG. 1 along the line V-V' according to yet another disclosed embodiment. As shown in FIG. 18, the flexible lighting device 1800 includes a first flexible substrate 510, a heat sink 520, first and second conductive elements 130, 140, a light-emitting element 210, a lens 710, first and second contact elements 230, 240, first and second conductive connectors 235, 245, an affixing layer 540, a conformal layer with phosphor 1670, and a conformal layer without phosphor 1675.

In FIG. 18, the first flexible substrate 510, the heat sink 520, the first and second conductive elements 130, 140, the light-emitting element 210, the first and second contact elements 230, 240, the first and second conductive connectors 235, 245, and the affixing layer 540 operate as disclosed above with respect to FIGS. 5, 8, and 16. Therefore, a description of these elements will not be repeated for this embodiment.

The embodiment of FIG. 18 differs from the embodiments of FIGS. 5, 8, and 16 in that it: (1) uses a conformal layer without phosphor 1675 instead of a second flexible substrate 530; (2) in that it employs a conformal layer with phosphor 1670 over the light-emitting elements 210; and (3) in that it employs a lens 710 over the light-emitting element 210.

Method of Manufacturing a Flexible Lighting Device

FIGS. 19-24C are side cross-sectional views illustrating a manufacturing process of the flexible lighting devices of FIGS. 1-18 according to disclosed embodiments.

Figure 19:
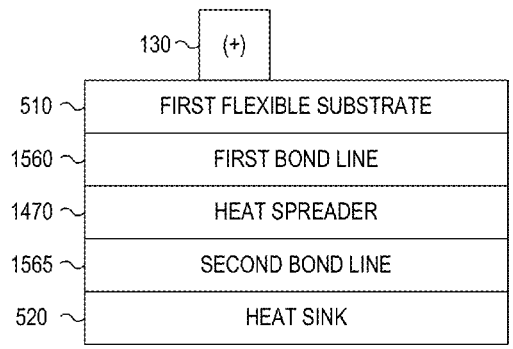
Figure 25:
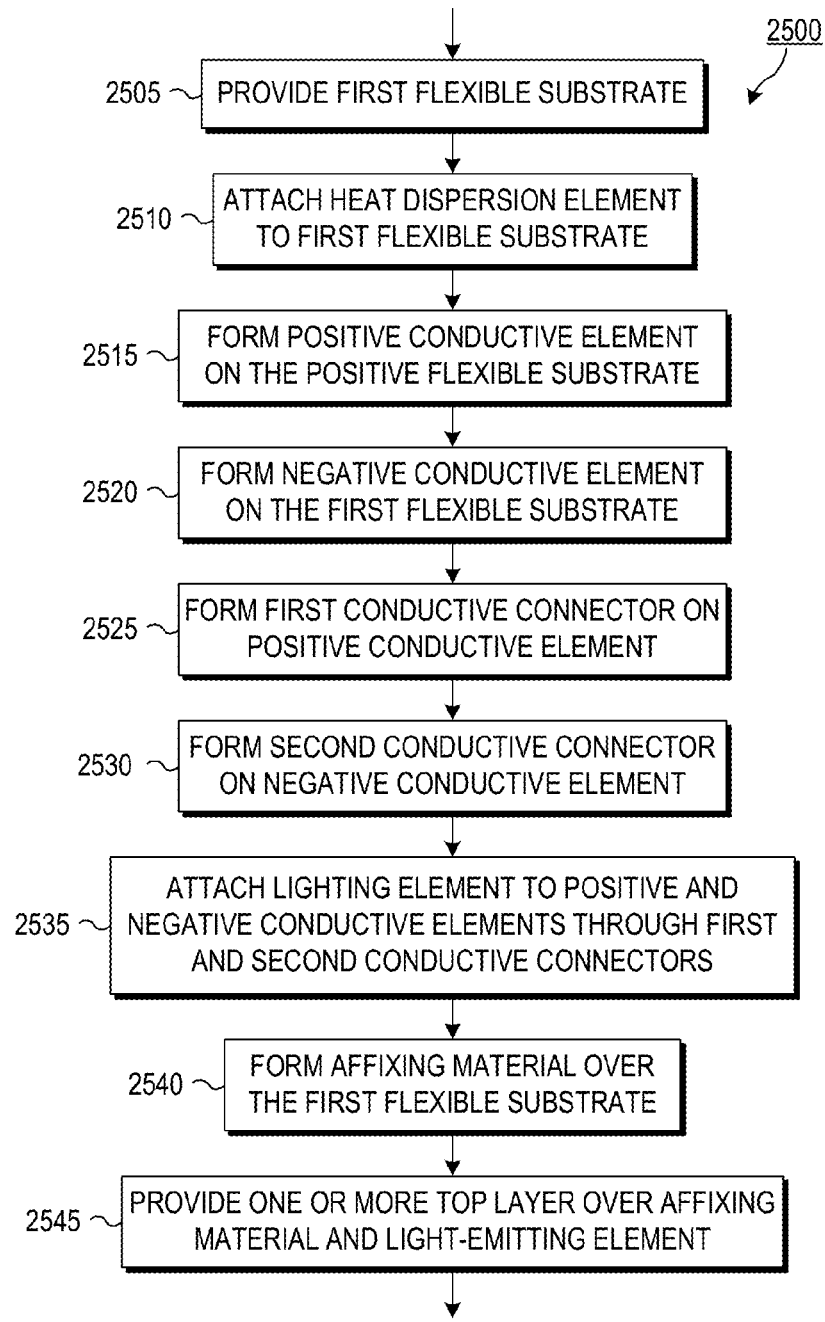
FIG. 25 is a flow chart showing a manufacturing process of a flexible lighting device according to a disclosed embodiment.

As shown in FIGS. 19 and 25, the manufacturing process 2500 may begin by providing a first flexible substrate 510 (2505). A heat dissipation structure is then attached to one side of the first flexible substrate 510 (2510). This heat dissipation structure includes at least a heat sink 520, but may also include a heat spreader 1470, a first bond line 1560, and a second bond line 1565.

A positive conductive element 130 is then formed on the opposite side of the first flexible substrate 510 as the heat dissipation structure was attached (2515). This can be accomplished, for example, by laying a buss bar or wire on the first flexible substrate 510, or attaching a buss bar or wire onto the first flexible substrate 510.

Figure 20:
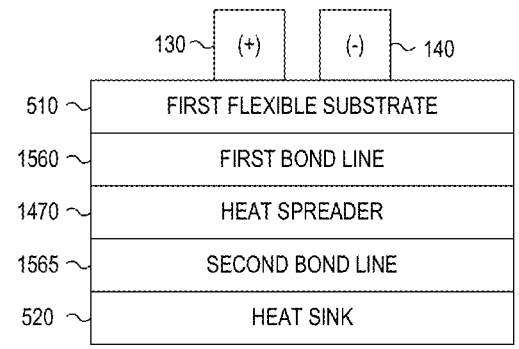

As shown in FIGS. 20 and 25, the manufacturing process 2500 continues with the negative conductive element 140 being formed on the same side of the first flexible substrate 510 as the positive conductive element 130 (2520). This can be accomplished, for example, by laying a buss bar or wire on the first flexible substrate 510, or attaching a buss bar or wire onto the first flexible substrate 510.

Although FIGS. 19, 20, and 25 disclose that the positive and negative conductive elements 130, 140 are deposited in separate steps, in some embodiments they can be formed onto the first flexible substrate 510 at the same time.

Figure 21:
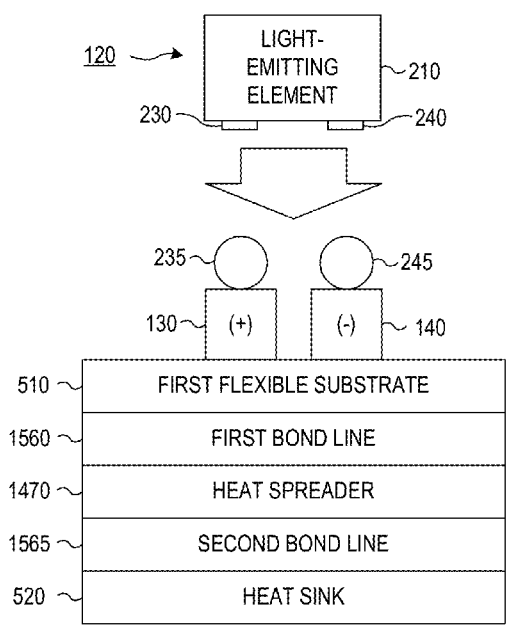

As shown in FIGS. 21 and 25, the manufacturing process 2500 continues by forming a first conductive connector 235 on the positive conductive element 130 (2525), and forming a second conductive connector 245 on the negative conductive element 140 (2530). A lighting element 120 is then provided above the first and second conductive connectors 235, 245, and is lowered down such that the first and second connecting elements 230, 240 on the lighting element 120 are brought adjacent to the first and second conducting connectors 235, 245, respectively.

Although FIGS. 21 and 25 disclose that the first and second conductive connectors 235, 245 are formed in separate steps, in some embodiments they can be formed onto the positive and negative conductive elements 130, 140 at the same time.

Figure 22:
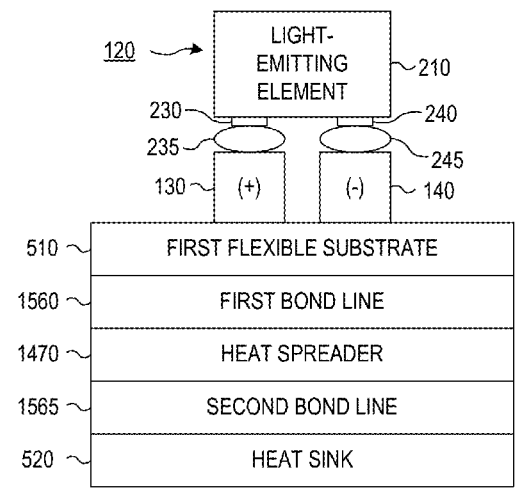

As shown in FIGS. 22 and 25, the manufacturing process 2500 continues as the lighting element 120 is brought into contact with the first and second connecting conductors 235, 245. When this is done, the first and second connecting elements 230, 240, come into contact with the first and second conducting connectors 235, 245, respectively. In this way the lighting element 120 is attached to the positive and negative conductive elements 130, 140 through the first and second conductive connectors 235, 245 (2535). In particular, the first connecting element 230 of the lighting element 120 is connected to the positive conducting element 130 through the first conducting connector 235. Likewise the second connecting element 240 of the lighting element 120 is connected to the negative conducting element 140 through the second connecting conductor 245.

Figures 23, 24A:
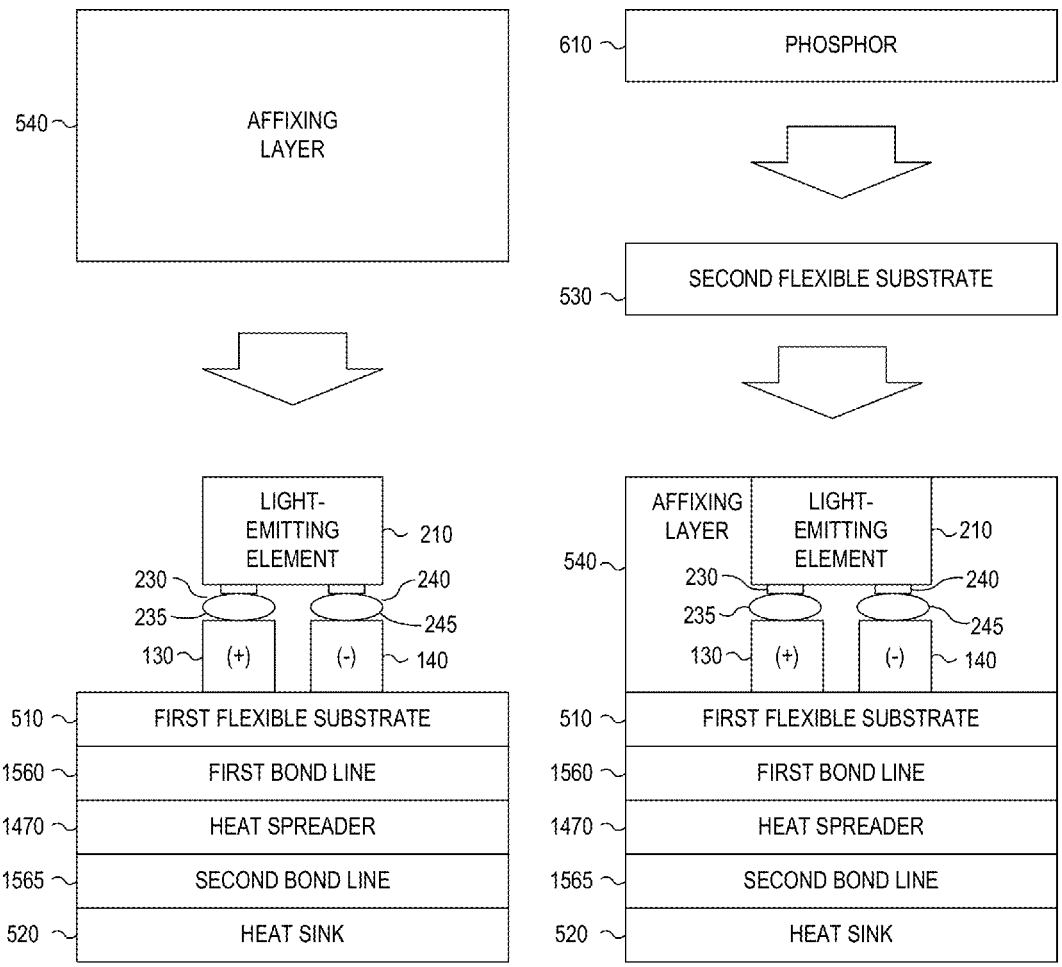

As shown in FIGS. 23 and 25, the manufacturing process 2500 continues as an affixing material 540 is provided adjacent to the first flexible substrate 510 and the elements formed on top of the first flexible substrate 510, and is pressed onto the first flexible substrate 510 and the elements formed on top of the first flexible substrate 510 (2540). During this process, the affixing material 540 will flow around the lighting elements 120 and the positive and negative conducting elements 130, 140 such that it does not disturb these elements, but also affixes them in place.

As shown in FIG. 25, the manufacturing process 2500 continues as one or more top layers are provided over the affixing material and the lighting element 120 (2545). This operation can be accomplished in a number of ways in various embodiments, as shown by FIGS. 24A-24C.

As shown in FIG. 24A, a second flexible substrate 530 can be provided adjacent to the affixing layer 540 as a first top layer, and can be pressed down to fix the second flexible substrate 530 to the first flexible substrate 510 via the affixing layer 540 (2545). This is by way of example only. In alternate embodiments, the affixing material 540 could be initially applied first to the second flexible substrate 530.

A phosphor layer 610 can then be deposited over the second flexible substrate 530 as a second top layer. This results in the flexible lighting device 600 of FIG. 6.

As shown in FIG. 24B, a conformal layer with a phosphor 1565 can be provided adjacent to the affixing layer 540 as a first top layer, and can be deposited on the affixing layer 540 (2545). This results in the flexible lighting device 1500 of FIG. 15.

The conformal layer 1565 is generally deposited in a viscous form and then hardened using either heat or ultraviolet light.

Although the embodiment of FIG. 24B discloses that the conformal layer 1565 includes a phosphor, in alternate embodiments this may not be the case. If a single color light is desired, the phosphor may not be required.

As shown in FIG. 24C, a conformal layer with phosphor 1670 can be deposited over only the light-emitting element 210 as a first top layer. A conformal layer without phosphor 1675 can then be deposited over the conformal layer with phosphor 1670 and the affixing layer 540. This results in the flexible lighting device 1600 of FIG. 16. In this way, phosphor need only be used in a conformal layer where it is needed, i.e., directly over the light-emitting elements 210.

The conformal layers 1670, 1675 are each generally deposited in a viscous form and then hardened using heat, infrared light or ultraviolet light. The conformal layers 1670, 1675 may also be air cured.

In the embodiments disclosed in FIGS. 5 to 18, little to none of the affixing material 540 remains between the lighting elements 120 and the second flexible substrate 510/conformal layer 1565/conformal layer 1670. However, in alternate embodiments, some portion of the affixing material 540 may remain between the lighting elements 120 and the second flexible substrate 510.

FIG. 26 is a flow chart showing a process 2510 of attaching a heat dispersion element to a first flexible substrate according to disclosed embodiments. As shown in FIG. 26, the process begins by attaching a first bond line 1560 to the first flexible substrate 510 (2610).

A heat spreader 1470 is then attached to the first bond line 1560 (2620). This heat spreader 1470 is configured to dissipate heat primarily in a direction parallel to a surface of the heat spreader 1470.

A second bond line 1565 is then attached to the heat spreader 1470 (2630).

Finally, a heat sink 520 is attached to the second bond line 1565 (2640). This heat sink 520 is configured to dissipate heat primarily in a direction perpendicular to a surface of the heat sink 520.

FIGS. 27A and 27B are flow charts showing a process 2535 of attaching a lighting element 120 to conductive elements 130, 140 according to disclosed embodiments.

As shown in FIG. 27A, in one embodiment, the process 2535 may begin by attaching a first (positive) contact element 230 of a light-emitting element 210 to the positive conductive element 130 via the first conductive connector 235 (2710).

A second (negative) contact element 230 of the light-emitting element 210 is then attached to the negative conductive element 140 via the second conductive connector 235 (2720).

A phosphor layer 420 can then be formed on the light-emitting element 210 (2730). This operation may be omitted in the fabrication of any flexible lighting device that does not require a phosphor layer 420. In addition, if this operation is performed during the fabrication process 2500, then operation 2545 should not include a phosphor layer as one of the top layers. This is because it is only necessary to have a single phosphor layer for a given light-emitting element 210.

Finally, a lens 710 can then be formed on the phosphor layer 420 (1940). This operation may be omitted in the fabrication of any flexible lighting device that does not require a lens 710.

As shown in FIG. 27B, in another embodiment, the process 2535 may begin by attaching a first (positive) contact element 230 of a light-emitting element 210 to the positive conductive element 130 via the first conductive connector 235 (2710).

A second (negative) contact element 230 of the light-emitting element 210 is then attached to the negative conductive element 140 via the second conductive connector 235 (2720).

Finally, a lens 810 is formed on light-emitting element 210 (2750). This operation may be omitted in the fabrication of any flexible lighting device that does not require a lens 810.

Figure 29:
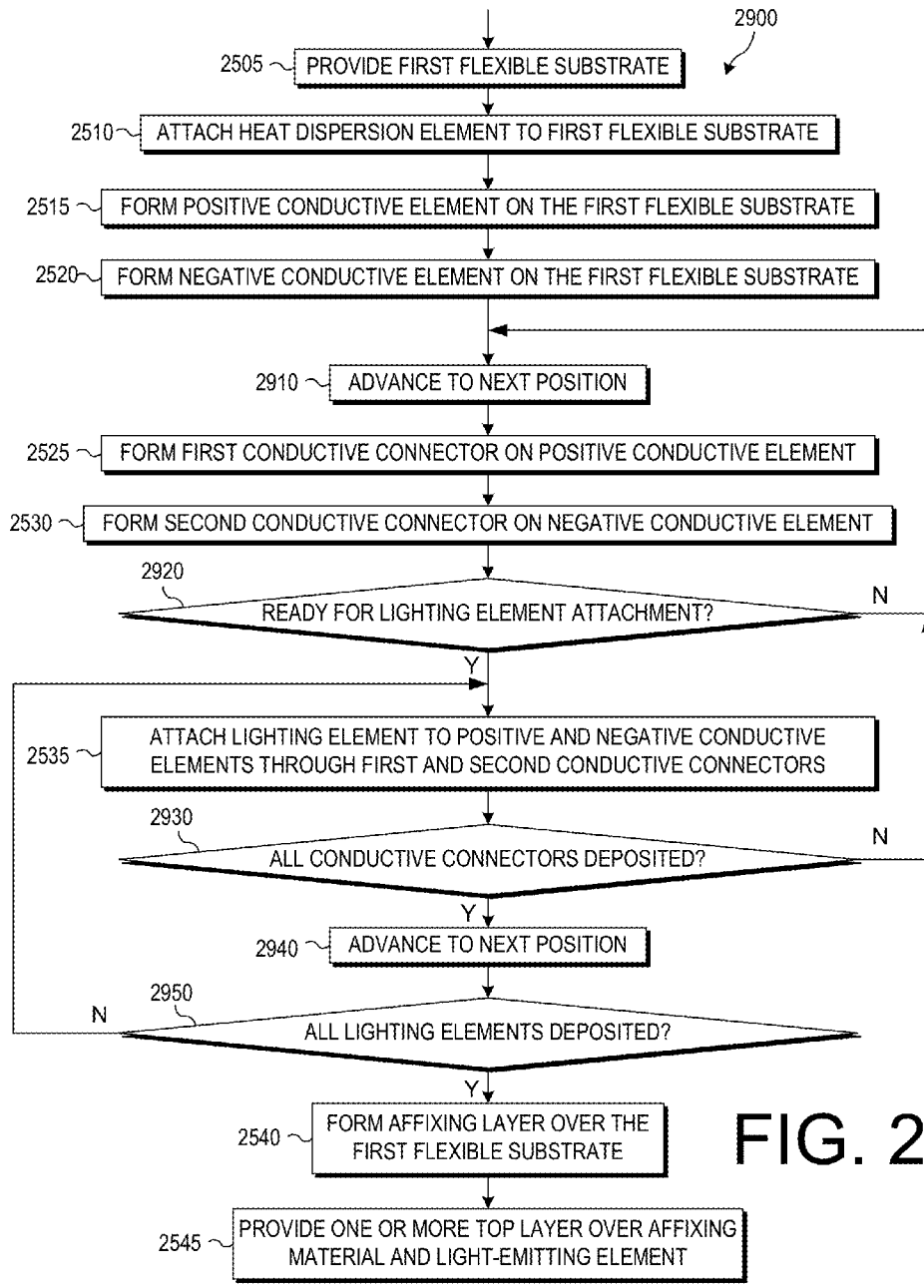
FIG. 29 is a flow chart showing a manufacturing process of a flexible lighting device according to another disclosed embodiment.

FIG. 28A-28C are flow charts showing a process of forming one or more top layers over the affixing material and the light-emitting element according to disclosed embodiments;

FIG. 29 is a flow chart showing a manufacturing process 2000 of a flexible lighting device according to another disclosed embodiment. Operations 2505, 2510, 2515, 2520, 2525, 2530, 2535, 2540, and 2545 are performed as described above with respect to FIG. 25. As a result, they will not be described in detail again with respect to FIG. 29.

In the operation of the manufacturing process 2900 of FIG. 29, a flexible lighting device including multiple lighting elements 120 is formed. The process 2900 begins by providing a first flexible substrate 510 (2505). The same first flexible substrate 510 is used for all of the multiple lighting elements 120.

A heat dispersion element is then attached to the bottom of the first substrate 510 (2510). This dispersion element can include heat sink 520, and may also include a heat spreader 1470.

Next, a positive conductive element 130 is formed on the first flexible substrate 510 (2515) and a negative conductive element 140 is formed on the first flexible substrate 510 (2520). The same positive and negative conductive elements 130, 140 are used for all of the multiple lighting elements 120.

In this exemplary manufacturing process 2900, a first device is provided to form the first and second conductive connectors 235, 245, and a second device is provided to attach a lighting element 120 to the first and second conductive elements 130, 140 through the first and second conductive connectors 235, 245. These two devices operate at the same time but at different places along the process flow. In particular, the first device that forms a set of first and second conductive connectors 235, 245 is located earlier in the process flow then the second device that attaches a lighting element 120 to the set of first and second conductive connectors 235, 245.

Because of this, the first device will have to deposit a certain number of sets of first and second conductive connectors 235, 245 onto the positive and negative connection element's 130, 140 before the first set of first and second conductive connectors 235, 245 are in a position to have a lighting element 120 attached to them. The exact number will depend upon the distance between the first device and the second device, and the distance between lighting elements 120 on the flexible lighting device 100 (i.e., how many sets of first and second conductive connectors 235, 245 will fit between the first device and the second device). As a result of this, the first device will operate on its own for a short time before the second device starts to operate.

Likewise, once the first device has deposited all of the required sets of first and second conductive connectors 235, 245, the second device will still have to attach lighting elements 120 to the remaining sets of first and second conductive connectors 235, 245. As a result of this, the second device will operate on its own for a short time after the first device ceases to operate. In particular, these operations occur as follows.

Once the positive and negative conductive elements 130, 140 have been provided on the first flexible substrate 510, the first flexible substrate 510 will be advanced to the next position (2910). When the process is just starting, this will be the starting position.

A first conductive connector 235 is then formed on the positive conductive element 130 (2525), while a second conductive connector 245 is formed on the negative conductive element 140 (2530). These two operations can be performed one after another or at the same time.

The process 2900 will then determine whether the first flexible substrate 510 is in a position to be ready for a lighting element 120 to be attached (2920). In other words, it will determine whether the first set of first and second conductive connectors 235, 245 have advanced far enough in the process flow that they can have a lighting element 120 attached to them.

If the answer is no (i.e., first set of first and second conductive connectors 235, 245 have not advanced far enough in the process flow that they can have a lighting element 120 attached to them), the process returns to operation 2010, advances to the next position, and forms another set of first and second conductive connectors 235, 245 (2525, 2530).

If, however, the answer is yes (i.e., first set of first and second conductive connectors 235, 245 have advanced far enough in the process flow that they can have a lighting element 120 attached to them), the process attaches a lighting element 120 to the positive and negative conductive elements 130, 140 through a corresponding set of first and second conductive connectors 225, 235 (2535).

The operation 2900 then determines whether all conductive connectors 235, 245 have been deposited (2930).

If the answer is no (i.e., all conductive connectors 235, 245 have not been deposited), the process returns to operation 2910, advances to the next position, and continues processing from there.

If, however, the answer is yes (i.e., all conductive connectors 235, 245 have been deposited), the process advances the flexible substrate 510 to the next position (2940) and determines whether all of the lighting elements 120 have been attached (2950).

If the answer is no (i.e., all of the lighting elements 120 have not been attached), the process returns to operation 2535, attaches the next lighting elements 120, and continues processing from there.

If, however, the answer is yes (i.e., all of the lighting elements 120 have been attached), the process provides an affixing layer 540 over the first flexible substrate 510 (2540), and provides one or more top layers over the affixing layer 520 and the light-emitting element 210 (2545).

In this way, a flexible lighting device including a plurality of lighting elements connected to the same positive and negative connecting elements 130, 140 is manufactured.

Figure 30:
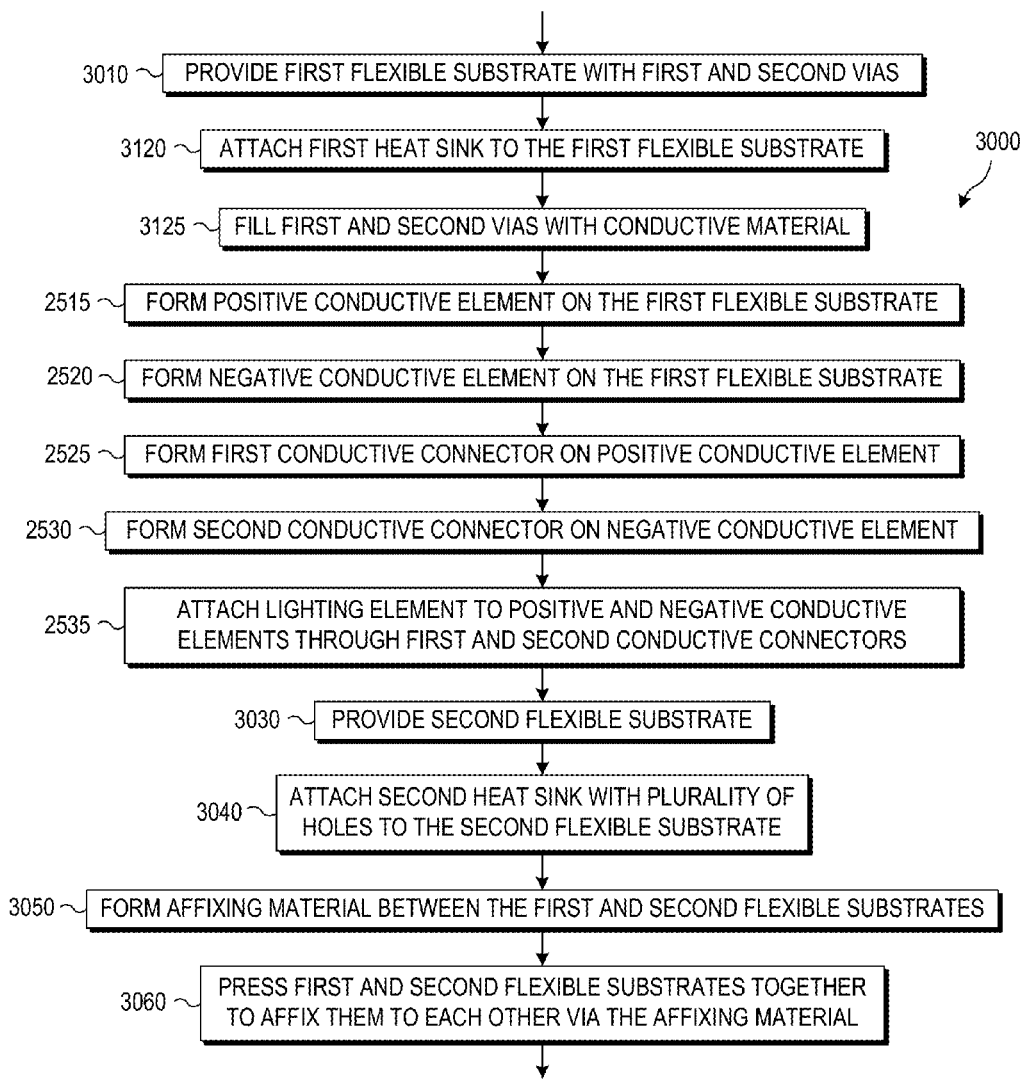
FIG. 30 is a flow chart showing a manufacturing process of a flexible lighting device according to yet another disclosed embodiment.

FIG. 30 is a flow chart showing a manufacturing process 30 of a flexible lighting device according to yet another disclosed embodiment. In this particular embodiment, two heat sinks are provided, one on each side of the flexible lighting device. This corresponds to the embodiment disclosed in FIGS. 11A and 11B, above. Operations 2515, 2520, 2525, 2530, and 2535 are performed as described above with respect to FIG. 25. As a result, they will not be described in detail again with respect to FIG. 30.

The manufacturing process 3000 begins by providing a first flexible substrate 1110 with first holes 1115 in it (3010).

A first heat sink 1120 is then attached to the first flexible substrate 1110 (3020).

Positive and negative conductive elements 130, 140 are then formed on the first flexible substrate 1110 (2515, 2520). Next, first and second conductive connectors 235, 245 are formed on the positive and negative conductive elements 130, 140, respectively (2525, 2530). A lighting element 120 is subsequently attached to the positive and negative conductive elements 130, 140 through the first and second conductive connectors 235, 245, respectively (2535).

A second heat sink 1140 is then attached to the second flexible substrate 530, the second heat sink 1140 having a plurality of gaps 1170 in it to accommodate the lighting elements 120 (2140)

An affixing material 540 is then formed between the first and second flexible substrates 1110, 530 (1845).

Finally, the first and second flexible substrates 1110, 530 are pressed together to affix themselves to each other via the affixing material 540 (1850).

Conclusion

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A flexible lighting element, comprising:
a first flexible substrate;
a first conductive element located on the first flexible substrate;
a second conductive element located on the first flexible substrate;
a light-emitting element having a first contact and a second contact, the first and second contacts both being on a first surface of the light-emitting element, the first contact being electrically connected to the first conductive element, the second contact being electrically connected to the second conductive element, and the light-emitting element being configured to emit light having wavelengths between 10 nm and 100,000 nm from a second surface opposite the first surface;
a flexible top layer located adjacent to the second surface of the light-emitting element, the second surface of the light-emitting element being on an opposite side of the light-emitting element from the first surface of the first light-emitting element; and
an affixing layer located between the first flexible substrate and the flexible top layer, the affixing layer being configured to affix the flexible top layer to the first flexible substrate; and
a heat spreading layer having a third surface and a fourth surface opposite the third surface, the heat spreading layer being affixed beneath the first flexible substrate at the third surface,
wherein the flexible top layer is substantially transparent to the selected wavelength of light.

2. The flexible lighting element of claim 1, wherein the heat spreading layer is configured to spread heat in a direction parallel or mostly parallel to the third and fourth surfaces.

3. The flexible lighting element of claim 1, wherein the first and second conductive connectors each comprise either an epoxy dot or an applied metal pad.

4. The flexible lighting element of claim 1, wherein the light-emitting element is an ultrathin light-emitting element, having a thickness of between 3 mil and 20 mil.

5. The flexible lighting element of claim 1, wherein the flexible top layer is one of a second flexible substrate and a hardened conformal coating.

6. The flexible lighting element of claim 1, wherein the heat spreading layer is attached to the first flexible surface by a first tape located between the heat spreading layer and the first flexible surface.

7. The flexible lighting element of claim 1, wherein the heat spreading layer comprises at least one layer of graphite, copper, aluminum, a phase change thermal material, or a composite material of thin layers of metal and low glass transition temperature polymers.

8. The flexible lighting element of claim 1, further comprising:
a heat sink layer attached to the fourth surface of the heat spreading layer, wherein
the heat sink layer is configured to pass heat primarily in a direction perpendicular or mostly perpendicular to the third and fourth surfaces.

9. The flexible lighting element of claim 8, wherein
the heat sink layer comprises at least one of aluminum, graphite, aluminum and copper.

10. The flexible lighting element of claim 8, wherein
the heat sink layer comprises an adhesive-coated thermal tape.

11. The flexible lighting element of claim 8, wherein
the heat sink layer is attached to the heat spreading layer by a second tape located between the heat sink layer and the heat spreading layer.

12. The flexible lighting element of claim 11, wherein
the second tape comprises a thermal adhesive tape.

13. A method of forming a flexible lighting element, comprising:
providing a first flexible substrate;
forming a first conductive element on the flexible first substrate;
forming a second conductive element on the flexible first substrate;
electrically connecting a first contact of a light-emitting element to the first conductive element;
electrically connecting a second contact of the light-emitting element to the second conductive element;
forming an affixing layer over the first flexible substrate;
forming a flexible top layer over the light-emitting element and the affixing layer such that the affixing layer affixes the flexible top layer to the first flexible substrate; and
attaching a heat spreading layer beneath the first flexible substrate,
wherein
the flexible top layer is substantially transparent to the selected frequency of light,
the first and second contacts are both on a first side of the light-emitting element,
the light-emitting element is configured to emit light having a first narrow range of wavelengths between 10 nm and 100,000 nm from a second surface opposite the first surface.
the heat spreading layer is attached to the bottom of the first flexible substrate at a third surface of the heat spreading layer, and
the heat spreading layer is configured to spread heat in a direction parallel or mostly parallel to the third surface.

14. The method of claim 13, wherein
the first and second conductive connectors each comprise either a conductive dot or an applied metal pad.

15. The method of claim 13, wherein
the light-emitting element is an ultrathin light-emitting element, having a thickness of between 3 mil and 20 mil.

16. The flexible lighting element of claim 13, wherein
the flexible top layer is one of a second flexible substrate and a hardened conformal coating.

17. The flexible lighting element of claim 13 wherein the operation of attaching a heat spreading layer beneath the first flexible substrate comprises:
attaching a first tape under the first flexible substrate; and
attaching the heat spreading layer under the first tape, such that the third surface contacts the first tape.

18. The method of claim 13, further comprising:
attaching a heat sink layer beneath the heat spreading layer, wherein
the heat sink layer is attached to the bottom of the heat spreading layer at the third surface of the heat spreading layer, and
the heat sink layer is configured to pass heat primarily in a direction perpendicular or mostly perpendicular to the third surface.

19. The flexible lighting element of claim 18, wherein the operation of attaching a heat sink layer beneath the heat spreading layer comprises:
attaching a second tape under the heat spreading layer, such that the second tape contacts the fourth surface of the heat spreading layer; and
attaching the heat sink layer under the second tape.

* * * * *